(12) United States Patent
Ohji et al.

(10) Patent No.: US 6,358,861 B1
(45) Date of Patent: Mar. 19, 2002

(54) MANUFACTURING METHOD OF SILICON DEVICE

(75) Inventors: Hiroshi Ohji; Kazuhiko Tsutsumi, both of Tokyo (JP); Patrick J. French, Delft (NL)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/658,864

(22) Filed: Sep. 8, 2000

Related U.S. Application Data

(63) Continuation of application No. PCT/JP99/00079, filed on Jan. 13, 1999.

(51) Int. Cl.[7] .................. H01L 21/302; H01L 21/461
(52) U.S. Cl. .................. 438/746; 438/747; 438/753; 438/977
(58) Field of Search .................. 438/746, 747, 438/748, 977, 978, 700, 53, 701, 753

(56) References Cited

U.S. PATENT DOCUMENTS

| | | | |
|---|---|---|---|
| 4,874,484 A | | 10/1989 | Foell et al. |
| 5,262,021 A | | 11/1993 | Lehmann et al. |
| 5,306,647 A | | 4/1994 | Lehmann et al. |
| 5,348,627 A | * | 9/1994 | Propst et al. ............. 204/129.3 |
| 5,427,975 A | * | 6/1995 | Sparks et al. .................. 437/79 |
| 5,510,276 A | * | 4/1996 | Diem et al. .................... 437/24 |
| 5,576,250 A | * | 11/1996 | Diem et al. .................. 437/228 |
| 6,020,618 A | * | 2/2000 | Sakai .......................... 257/419 |
| 6,194,236 B1 | * | 2/2001 | Sakai et al. .................... 438/17 |

OTHER PUBLICATIONS

Ohji et al.; "Fabrication of free standing structure using single step electrochemical etching in hydrofluoric acid"; pp. 246–250; Micro Electro Mehanical Systems 1998. MEMS '98; Jan. 25–29, 1998.*

Voss et al.; "Light–controlled, electrochemical, anisotropic etching of silicon"; pp. 140–143; 1991 International Conference on Solid–State Sensors and Actuators, 1991. Digest of Technical Papers, Transducers '91., Jun. 24–27, 1991.*

Ozdemir et al.; "New phenomena obsreved in electrochemical micormachining of silicon"; pp. 132–135; 1991International Conference on Solid–State Sensors and Actuators, 1991. Digest of Technical Papers, Transducer '91., Jun. 24–27 1991.*

Ohji et al.; "Free Standing Beams Made by Single Step Electrochemical Etching in Hydrofluoric Acid", *Proceedings of the Dutch Sensor Conf.,* pp. 201–206, Mar. 2–3, 1998.

Ohji et al.; "Fabrication of Free Standing Structure Using Single Step Electrochemical Etching in Hydrofluoric Acid", *IEEE,* pp. 246–250, 1998.

* cited by examiner

*Primary Examiner*—Wael Fahmy
*Assistant Examiner*—Fernando Toledo
(74) *Attorney, Agent, or Firm*—Leydig, Voit & Mayer, Ltd.

(57) ABSTRACT

A method of manufacturing a silicon device with a single crystal structure, including forming etching start patterns on a surface of a silicon substrate; etching the silicon substrate by applying a voltage to the silicon substrate while the silicon substrate is immersed in a solution containing fluorine ions, with the silicon substrate used a positive electrode, to form narrow etched portions that extend into the substrate from the etching start patterns; and accelerating etching of the silicon substrate by increasing current flowing through the silicon substrate after the narrow etched portions have reached a predetermined depth, so that neighboring etched portions are in communication with each other below the narrow etched portions and a free standing structure including part of the silicon substrate is formed, and a hollow portion is formed below the free standing structure.

18 Claims, 15 Drawing Sheets

US 6,358,861 B1

MANUFACTURING METHOD OF SILICON DEVICE

This application is a continuation application of PCT international application No.PCT/JP99/00079 which has an international filing date of Jan. 13, 1999 which designated the United States, the entire contents of which are incorporated by reference.

TECHNICAL FIELD

The present invention relates to a method of manufacturing a silicon device fabricated by processing a silicon substrate, such as various sensors used for measuring inertial force caused by acceleration or angular velocity etc., pressure or other various physical quantities, or a fluid device having a passage through which fluid or the like flows, the passage being formed in the silicon substrate.

BACKGROUND ART

Conventionally, a cantilever or a mass of free standing structure formed on a silicon substrate, or a hollow structure formed in the silicon substrate etc., is broadly used for sensors for measuring various physical quantities, micro pumps and so on.

FIGS. 15A to 15F are views showing a conventional manufacturing process for fabricating a device having a movable portion on a silicon substrate. According to the manufacturing process, a plate-shaped silicon substrate 32 is prepared at first, as shown in FIG. 15A. Next, as shown in FIG. 15B, a first oxide film 33, which is to be used as a sacrificial layer, is formed on the silicon substrate 32 by means of the CVD technique or the like, and then a first polysilicon film 34, which is to be used as a seed layer, is formed on the oxide film by means of the low pressure CVD technique or the like. After that, as shown in FIG. 15C, a second polysilicon film 35, which is to become a structural part, is formed on the first polysilicon film 34 using an epitaxial reactor. Further, after the second polysilicon film 35 of a desired thickness has been obtained, as shown in FIG. 15D, a second oxide film 36 as the uppermost layer is formed on the second polysilicon film 35 by means of the CVD technique or the like, and then the second oxide film 36 is subjected to a patterning treatment so as to obtain the structural part of the desired shape. The patterned second oxide film 36 is used as a mask for etching the first and second polysilicon films 34,35 which are to become the structural part thereunder. Next, as shown in FIG. 15E, an etching treatment is performed to the first polysilicon film 34 and the second polysilicon film 35 by means of the reactive ion etching technique or the like till the etching reaches the first oxide film 33. Further, as shown in FIG. 15F, a part of the first oxide film 33, which is located under the first polysilicon film 34, is removed by using hydrofluoric acid or the like. In consequence, there is obtained a movable portion which is substantially composed of the first polysilicon film 34 and the second polysilicon film 35.

FIGS. 16A to 16E are views showing a conventional manufacturing process of a structural part having a movable portion, which is disclosed, for example, in pages 52 to 55 of the bulletin of "The 8th International Conference on Solid-State sensors and Actuators, and Eurosensors IX" held in Stockholm on June in 1995. According to this manufacturing process of the structural part, as shown in FIG. 16A, at first, a first oxide film 38 and a photoresist film 37 are formed on a silicon substrate 39 by turns. Next, as shown in FIG. 16B, the first oxide film 38 is patterned using the photolithography technique so that an oxide film mask is formed. Further, as shown in FIG. 16C, the silicon substrate 39 is etched using the oxide film mask, for example, by means of the reactive ion etching technique so that trenches or holes are formed. Following that, as shown in FIG. 16D, in order to protect side surfaces of the trenches or holes, a second oxide film 40 is formed, for example, by means of the CVD technique, and then portions of the second oxide film 40, which exist on the bottoms of the trenches or holes, are removed by means of the reactive ion etching technique. Then, as shown in FIG. 16E, each neighboring trenches or holes are communicated with each other below the structural part by performing an isotropic reactive ion etching treatment to the silicon substrate 39 using another reactive gas. In consequence, the structural part having free standing structure may be obtained.

FIG. 17 is a view showing a conventional etching apparatus, which is disclosed, for example, in pages 653 to 659 of Number 2 in Volume 137 of "Journal of Electrochemical Society" published on February in 1990. As shown in FIG. 17, the etching apparatus is provided with a power source of constant voltage 41, an amperemeter 42, a counter electrode 43, a reference electrode 44 and an etchant vessel 48 containing an etchant 47. In the etching apparatus, after pits with inverted square pyramid shapes have been formed on a surface of a plate-shaped n-type silicon substrate 46 using KOH, a voltage is applied to the silicon substrate 46 while the silicon substrate 46 is immersed in the hydrofluoric acid aqueous solution, with the silicon substrate used a positive electrode. In addition, light 45 is applied to the silicon substrate 46. In consequence, the silicon substrate 46 is etched in the direction depthwise of the substrate. Thus, regularly disposed pores may be formed by means of the etching process.

FIGS. 18A to 18F are views showing a conventional manufacturing process of a silicon device, which is disclosed, for example, in pages 189 to 197 of Volume 3223 of "Proceedings SPIE Micromachining and Microfabrication Process Technology III" published at Austin in Texas (U.S.A.) on September in 1997. According to the manufacturing process of the silicon device, as shown in FIG. 18A, at first, a plate-shaped n-type silicon substrate 49 is prepared. Further, as shown in FIG. 18B, a silicon nitride film 50 is formed on a surface of the silicon substrate 49. Following that, as shown in FIG. 18C, the silicon nitride film 50 is patterned by means of the photolithography technique so that a pattern 51 is formed. Next, as shown in FIG. 18D, pits 52 with inverted triangle shapes are formed on the silicon substrate 49 using KOH. Moreover, the silicon nitride film 50, which has been used as a mask for the etching using KOH, is removed so that the silicon substrate 49 having the pits 52 as shown in FIG. 18E is obtained. Then, as shown in FIG. 18F, a voltage is applied to the silicon substrate 49 while the silicon substrate 49 is immersed in a hydrofluoric acid aqueous solution, with the silicon substrate used a positive electrode. In addition, light is applied to the silicon substrate 49 so that the silicon substrate is etched in the direction depthwise of the substrate. Thus, trenches 54 are formed in the silicon substrate 49.

Meanwhile, FIG. 19 is a view showing a stepwise reaction mechanism when a conventional p-type silicon substrate is etched in the direction depthwise of the substrate by applying a voltage to the p-type silicon substrate while immersing the p-type silicon substrate in an organic solution including a hydrofluoric acid aqueous solution, with the substrate used as a positive electrode. The mechanism is disclosed, for example, in pages 1006 to 1013 of Number 4 in Volume 141 of "Journal of Electrochemical Society" published on April in 1994. At first, a hydrogen atom [H], which is combining with a silicon atom [Si] on the uppermost surface of the silicon substrate as indicated by (A) in FIG. 19, is changed to a hydrogen ion [H$^+$] due to functions of a fluorine ion [F$^-$] and a hole [h$^+$] so that the bonding between the hydrogen ion and the silicon atom is ruptured while the silicon atom is changed to a silicon radical as indicated by (B). Further, the silicon radical combines with a fluorine atom due to supply of the fluorine ion and an electron [e$^-$] as indicated by (C). Then, as indicated by (D) and (E), the same reaction occurs as to another remaining hydrogen atom, in consequence the silicon atom combines with two fluorine atoms. Moreover, as indicated by (F), the other two bonding hands, each of which has combined with another inner silicon atom, also combine with fluorine atoms due to functions of two hydrogen fluoride molecules [HF], respectively, so that the silicon atom dissolves into the organic solution as silicon tetrafluoride [SiF$_4$].

Meanwhile, in the above-mentioned conventional structural part with free standing structure, which is formed of polysilicon, there is such a problem that the mechanical properties and the reliability are inferior to those of a structural part formed of single crystal silicon. Further, in the conventional manufacturing process, it is impossible to thicken the sacrificial layer for fabricating the hollow structure so that it is impossible to sufficiently enlarge the gap between the movable portion (structural part) and the substrate. Therefore, there is such a problem that the movable portion may stick to the bottom surface of the substrate. Further, there is such a problem that because a complicated manufacturing process is required to fabricate the structural part of single crystal silicon having the free standing structure, it is impossible to fabricate the structural part by means of a simple manufacturing process while improving the yield and raising the reliability. Meanwhile, in the conventional process, when the n-type silicon substrate is etched in the hydrofluoric acid aqueous solution, it is only possible to form pores whose diameters are equal to or smaller than 10 μm, or trenches whose widths are 3 μm. Therefore, for example, it is impossible to fabricate a silicon device of three-dimensional structure having a hollow configuration. Moreover, in the conventional process, there is such a problem that when the p-type silicon substrate is etched in the organic solution including the hydrofluoric acid aqueous solution, it is impossible to control the size or position of the portion which is to be etched.

Meanwhile, the present inventors developed and investigated the manufacturing technique of the silicon device in order to solve the above-mentioned problems. Thus, the present inventors announced the results of the investigation under the title of "Fabrication of free standing structure using single step electrochemical etching in hydrofluoric acid" in "The Eleventh Annual International Workshop on Micro Electro Mechanical Systems" held at Heidelberg in Germany during the period from Jan. 25–29, 1998. Further, the results of the investigation is disclosed in pages 246 to 250 of the bulletin of the Workshop (IEEE Catalog Number 98CH36176, Pages 246–250). In the announced investigation, it was clarified that the free standing structure could be fabricated by using an n-type of (100) wafer. Hereupon, the condition for fabricating the free standing structure is such that the etching process is initially performed with the current density of 26 mA/cm$^2$ for thirty minutes, and then performed for seven minutes while the current density is increased to 40 mA/cm$^2$, using a hydrofluoric acid aqueous solution of 5%. In consequence, the present inventors succeeded in fabricating a cantilever of free standing structure.

DISCLOSURE OF INVENTION

The present invention has been developed to solve the above-mentioned conventional problems, and has an object of providing a method of manufacturing a silicon device, which is capable of forming a structural part using a single crystal silicon, enlarging the gap between the substrate and the structural part sufficiently, fabricating free standing structure by one single step, providing the silicon device having the free standing structure while improving the yield and raising the reliability, and further manufacturing the above-mentioned silicon device by means of a simple manufacturing process.

A method of manufacturing a silicon device according to a first aspect of the present invention, which has been developed to achieve the above-mentioned object, is characterized in that it includes (i) an etching start pattern forming step for forming etching start patterns on a silicon substrate or on a surface of the silicon substrate, (ii) a first etching step for etching the silicon substrate by applying a voltage to the silicon substrate to form etched portions (for example, openings, trenches) that extend in a direction depthwise of the silicon substrate from the etching start patterns while the silicon substrate is immersed in a solution containing fluorine ions, with the silicon substrate used a positive electrode, and (iii) a second etching step for accelerating etching of the silicon substrate by increasing a current flowing through the silicon substrate after the etched portions have reached a predetermined depth, to thereby form a free standing structure composed of a part of the silicon substrate wherein each neighboring etched portions are communicated with each other (namely, etched surfaces are connected) at a location deeper than the predetermined depth.

In the silicon device having a free standing structure, which is manufactured according to the above-mentioned method, the free standing structure is fabricated by means of the etching process by one single step, and the free standing structure is made of single crystal silicon. On the occasion, the depth of the hollow portion can be controlled by varying the time for performing the etching process. In consequence, the structure formed of single crystal silicon, which has excellent mechanical properties, may be easily fabricated by one single step. Further, because the movable portion composed of the structure, may be prevented from sticking to the substrate, the silicon device, which has high reliability, may be cheaply manufactured with good yield using a low-priced manufacturing apparatus. That is, according to the present manufacturing method, because the free standing structure of the manufactured silicon device is composed of single crystal silicon, the obtained device has excellent mechanical properties and high reliability. Further, because the hollow portion below the free standing structure may be formed with a large size, the free standing structure does not stick to the plate-shaped substrate thereunder so that the yield may be highly improved. In addition, according to the present method of manufacturing the silicon device, because the movable portion composed of the free standing structure can be fabricated in one single step, the manufacturing process may be simplified so that the silicon device may be obtained at a low cost.

A method of manufacturing a silicon device according to a second aspect of the present invention is characterized in that it includes (i) an etching start pattern forming step for forming etching start patterns on a silicon substrate or on a surface of the silicon substrate, (ii) a first etching step for etching the silicon substrate by applying a voltage to the silicon substrate to form narrow etched portions (openings, trenches) that extend in a direction depthwise of the silicon substrate from the etching start patterns while the silicon substrate is immersed in a solution containing fluorine ions, with the silicon substrate used a positive electrode, (iii) a second etching step for accelerating etching of the silicon substrate by increasing a current flowing through the silicon substrate after the narrow etched portions have reached a predetermined depth, to thereby form wide etched portions (openings, trenches) wider than the narrow etched portions at a location deeper than the predetermined depth, and (iv) a hollow passage forming step for forming a hollow passage in the silicon substrate by burying the narrow etched portions after the wide etched portions have reached another predetermined depth.

In the manufacturing method, because the hollow passage formed in the silicon substrate can be fabricated by means of a simple manufacturing process, the silicon device having high reliability can be obtained at a low cost. That is, according to the manufacturing method, because the hollow passage in the silicon substrate, through which a fluid can be passed, may be fabricated by means of the simplified step, its productivity may be improved and further the silicon device may be obtained at a low cost.

In the method of manufacturing the silicon device according to the first or second aspect of the present invention, the etching start patterns may consist of pits formed on the surface of the silicon substrate, a mask formed on the silicon substrate or p-type regions formed by burying p-type materials in a surface of an n-type silicon substrate.

Hereupon, when the etching patterns consist of the pits, the etching patterns can be formed by means of a technique which does not depend on the crystal orientation of the silicon substrate, and further the manufactured silicon device is not affected by the crystal orientation of the silicon substrate. Therefore, the silicon device can be fabricated in any desired shape. In consequence, the fabricated silicon device may have excellent functions and also be small-sized. That is, because the etching start patterns are formed by the technique, such as the reactive ion etching technique or the like, which is not affected by the crystal orientation of the silicon substrate composed of silicon, the etching start patterns can be formed in any desired shapes on the silicon substrate so that the free standing structure fabricated by the continuously performed etching process may have any desired shape. Therefore, the obtained silicon device structure may have an excellent performance and also be small-sized.

When the etching start patterns consist of the mask, the manufacturing step is simplified, and further the structure can be fabricated in any desired shape without being affected by the crystal orientation of the silicon substrate. In consequence, the silicon device, which has excellent functions and is small-sized, can be manufactured at a low cost. That is, because the etching start patterns are composed of, for example, a silicon nitride film which has been patterned by the photolithography technique and is not affected by the crystal orientation of the silicon substrate, they may have any desired shapes on the silicon substrate. In consequence, the free standing structure fabricated by the continuously performed etching process may have any desired shapes so that the fabricated silicon device structure may have an excellent performance and be small-sized. Further, because the initial etching step for etching the silicon substrate is not required when the etching start patterns are formed, the manufacturing process is simplified so that the silicon device may be obtained at a low cost.

When the etching start patterns consist of the p-type regions, the etching patterns can be formed by a technique which does not depend on the crystal orientation of the silicon substrate, and further the manufactured silicon device is not affected by the crystal orientation of the silicon substrate. Therefore, the silicon device can be fabricated in any desired shape. In consequence, the fabricated silicon device may have an excellent performance and be small-sized. That is, because the mask used for the ion implantation to form the etching start patterns is not affected by the crystal orientation of the silicon substrate, the etching start patterns, in which the p-type materials are implanted into the substrate, can be formed in any desired shape on the silicon substrate. In consequence, the free standing structure fabricated by the continuously performed etching process may have any desired shape so that the fabricated silicon device structure may have an excellent performance and be small-sized.

When an n-type silicon substrate is used as the silicon substrate in the method of manufacturing the silicon device according to the present invention, the current flowing through the silicon substrate can be controlled by varying the light intensity or the voltage applied to the silicon substrate while applying light to the silicon substrate in each of the first and second etching steps.

In that case, because the n-type silicon substrate is used, positive holes required for the etching are supplied by applying light. In consequence, the supplying amount of the holes can be controlled by varying the light intensity so that the device having the free standing structure can be fabricated with good accuracy. In the silicon device fabricated in the above-mentioned manner, because the fabricated free standing structure is composed of single crystal silicon, the obtained device may have excellent mechanical properties and high reliability. Further, because the hollow portion below the free standing structure can be formed with a large size, the free standing structure may not stick to the plate-shaped substrate thereunder. In consequence, its yield may be highly improved. Moreover, according to the method of manufacturing the silicon device, the movable portion consisting of the free standing structure can be fabricated by one single step. In consequence, the manufacturing process is simplified so that the silicon device may be obtained at a low cost.

Meanwhile, when a p-type silicon substrate is used as the silicon substrate in the method of manufacturing the silicon device according to the present invention, the current flowing through the silicon substrate can be controlled by varying the voltage applied to the silicon substrate in the first or second etching step.

In that case, because the p-type substrate is used, positive holes required for the etching exist much more in the substrate. In consequence, it is not required to apply light to the silicon substrate so that the etching apparatus may be simplified and further there may be achieved a uniform etching rate in the silicon substrate. Therefore, the silicon device may have high reliability and be obtained at a low cost. Further, because the non-uniformity of the etching due to the distribution of the light intensity is prevented, the etching in the silicon substrate may be uniformly performed so that the silicon device may have high reliability and be obtained at a low cost. Moreover, because the fabricated free standing structure is composed of single crystal silicon in the silicon device manufactured by using the manufacturing method, the obtained device may have excellent mechanical properties and high reliability. Meanwhile, because the hollow portion below the free standing structure can be formed with a large size, the free standing structure may not stick to the plate-shaped substrate thereunder. In consequence, its yield may be highly improved. In addition, according to the method of manufacturing the silicon device, the movable portion consisting of the free standing structure can be fabricated by one single step. Therefore, the manufacturing process is simplified so that the silicon device may be obtained at a low cost.

BEST MODE FOR CARRYING OUT THE INVENTION

Figure 1A:
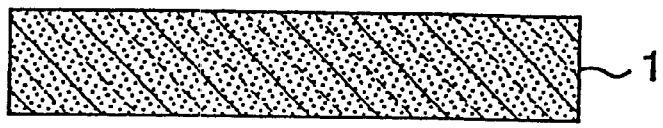
FIGS. 1A to 1E are sectional elevation views of a silicon substrate and intermediate silicon devices, respectively, which show a manufacturing process of a silicon device according to the first embodiment of the present invention.

Hereinafter, embodiments of the present invention will be concretely described with reference to the accompanying drawings. Hereupon, in each of the accompanying drawings, like members or constructive elements are designated by like reference numerals. Further, in the present specification, the term of "intermediate silicon device" means such a silicon substrate which is a raw material of a silicon device, to which any processing has been performed in the manufacturing process of the silicon device, but which has not been completed as a finished silicon device yet.

(The First Embodiment)

FIGS. 1A to 1E show the manufacturing process of the silicon device according to the first embodiment of the present invention. Hereinafter, the manufacturing process of the silicon device according to the first embodiment will be described with reference to those drawings.

Figure 1B:
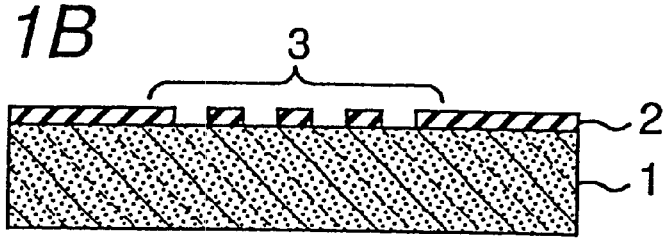
Figure 1C:
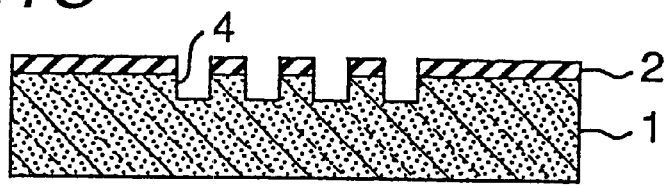

In the manufacturing process of the silicon device, at first, as shown in FIG. 1A, an n-type silicon substrate 1 of about 400 μm thickness is prepared. Further, as shown in FIG. 1B, for example, a silicon nitride film 2 of about 0.3 μm thickness is formed on the silicon substrate 1 by means of the sputter technique or the like, and then the silicon nitride film 2 is patterned by means of the photolithography technique or the like so that there is formed a mask 3 for the initial etching which is performed before the main etching. Next, as shown in FIG. 1C, the silicon substrate 1 is subjected to the initial etching process using the reactive ion etching technique so that etching start patterns 4 of about 3 μm depth are formed.

Figure 1D:
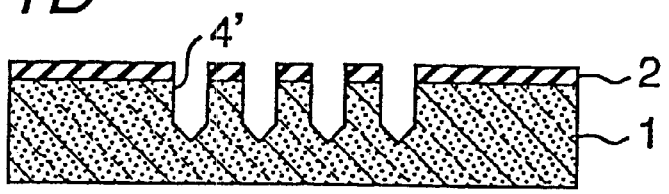
Figure 1E:
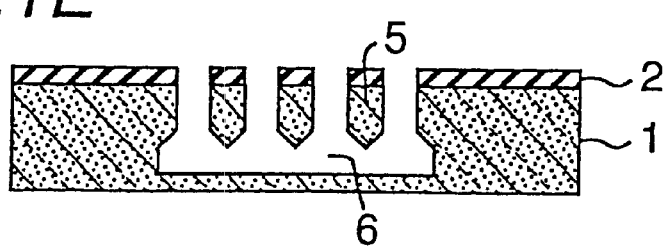

Further, a voltage of about 3V is applied between the silicon substrate 1 and a counter electrode while the silicon substrate 1 (intermediate silicon device) is immersed in a hydrofluoric acid aqueous solution of 5%, with the silicon substrate 1 used a positive electrode. On that occasion, light is applied to the back surface of the silicon substrate 1 using a halogen lamp of 150 w, whose light intensity can be arbitrarily varied, so that the silicon substrate 1 is etched in the direction depthwise of the silicon substrate 1. Hereupon, the light intensity of the halogen lamp is adjusted so that the current density in the silicon substrate 1 is larger than or equal to 20 mA/cm$^2$, and is smaller than or equal to 30 mA/cm$^2$. Hereupon, as known in general, between the light intensity and the current density in the silicon substrate 1, there exists such a functional relation that the latter uniquely increases or decreases in accordance with the increase or decrease of the former. Thus, as shown in FIG. 1D, etched portions 4' (openings, trenches) formed under the etching start patterns 4 extend in the direction depthwise of the silicon substrate 1. Then, after the etched portions 4' formed by the etching process have reached the desired depth, the current density in the silicon substrate 1 is increased to or over 40 mA/cm$^2$ by increasing the light intensity of the halogen lamp. So, the etching process is performed for about ten minutes so that each neighboring etched surfaces (side walls of the etched portions) are communicated with each other (each neighboring etched portions are communicated with each other) in the lower part of the intermediate silicon device. In consequence, as shown in FIG. 1E, a single crystal free standing structure 5 composed of a part of the silicon substrate 1 is formed, while a hollow portion 6 is formed below the free standing structure 5.

The depth of the hollow portion 6, which is formed in the above-mentioned manner, can be set to any desired value by adjusting the time of etching process performed with the current density equal to or larger than 40 mA/cm$^2$ as described above. Hereupon, it is preferable that the concentration of the hydrofluoric acid aqueous solution used as the etchant is set to a value in the range from 1% to 20%. That is, electropolishing may occur if the concentration of the hydrofluoric acid aqueous solution is lower than 1%, while it may be impossible to obtain a smooth etched surface if it is higher than 20%. Therefore, it may be difficult to obtain a desired shape of device if the concentration is out of the above-mentioned range.

Meanwhile, it is preferable that the applied voltage is set to a value lower than or equal to 10V. Because, when the applied voltage is higher than 10V, a local dielectric breakdown may occur so that it may be difficult to obtain a smooth etched surface. Therefore, it may be difficult to obtain a desired shape of silicon device. Hereupon, the applied voltage described above does not mean the voltage outputted from the constant voltage power supply, but the voltage which is actually applied to the silicon substrate 1.

Further, it is preferable that the sheet resistance of the n-type silicon substrate 1 is set to a value in the range from 0.1 Ω·cm to 50 Ω·cm. Because, it may be impossible to obtain the desired shape of silicon device in which a micro porous silicon structure is formed on the etched surface if the sheet resistance of the silicon substrate 1 is lower than 0.1 Ω·cm, while it may be difficult to make the silicon device fine-shaped if it is higher than 50 Ω·cm.

Hereupon, the depth of the initial etching does not affect the main etching which is to be performed following that. However, if the initial etching is not performed, the dimensional accuracy of the fabricated structure is inferior in comparison with the case with the initial etching. Therefore, when the dimensional accuracy of the structure is required to be high, it is preferable that the initial etching is performed. Further, the initial thickness of the silicon substrate 1 does not affect the initial etching or the main etching which is to be performed following that. Meanwhile, if the current density in the silicon substrate 1 is varied by raising the applied voltage without varying the light intensity when the current density is increased to form the free standing structure, the same effects as described above may be obtained.

In the silicon device manufactured by the manufacturing method according to the first embodiment, because the free standing structure 5 is formed of single crystal silicon, the silicon device may have excellent mechanical properties and high reliability. Further, because it is possible to make the hollow portion 6 below the free standing structure 5 larger, the free standing structure 5 does not stick to the plate-shaped substrate thereunder. In consequence, its yield may be highly improved. Moreover, according to the method of manufacturing the silicon device, the movable portion including the free standing structure 5 can be fabricated in one step (in one single step). Consequently, the manufacturing process may be simplified so that the silicon device may be obtained at a low cost. Further, because the reactive ion etching technique used for the initial etching is not affected by the crystal orientation of the silicon substrate 1, the etching start patterns 4 can be formed on the silicon substrate 1 in any desired shape. In consequence, the free standing structure 5 fabricated in the following etching process also can have any desired shape so that the obtained silicon device structure may have an excellent performance.

Figure 2:
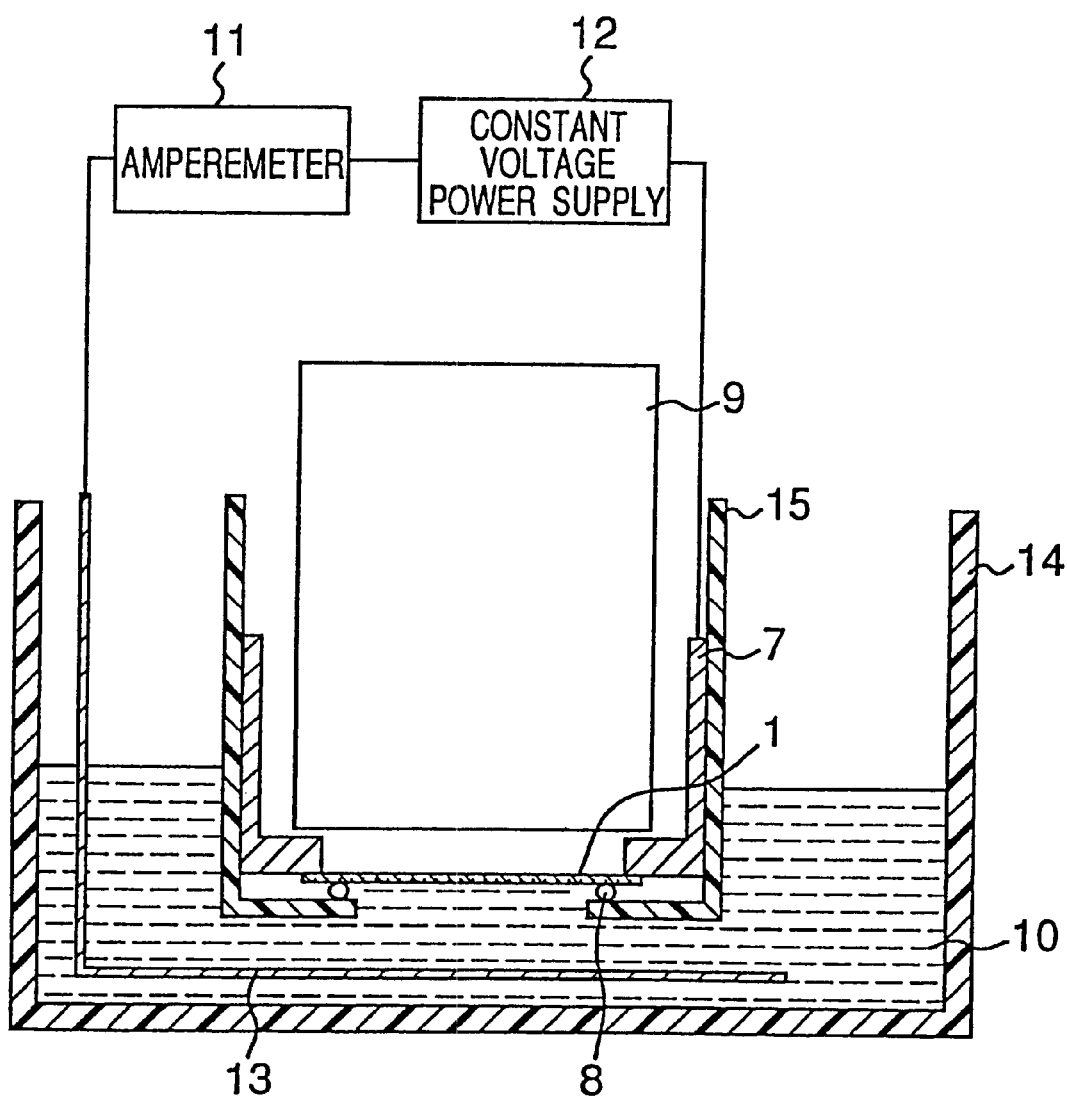
FIG. 2 is a sectional elevation view of an etching apparatus which is used when the silicon substrate is etched in the manufacturing process of the silicon device according to the first embodiment of the present invention.

FIG. 2 shows an etching apparatus which is used when the main etching is performed in the manufacturing process of the silicon device according to the first embodiment of the present invention. As shown in FIG. 2, the etching apparatus is provided with a silicon substrate holder 7 for holding the n-type silicon substrate 1 to which the etching is performed, and further achieving electrical conductivity between the silicon substrate 1 and the apparatus. The silicon substrate holder 7 is, for example, made of copper. Further, the etching apparatus is provided with an O-ring 8 having an excellent chemical resistance for preventing etchant 10 from leaking into the inner space of the silicon substrate holder 7, a light source 9 for producing pairs of electrons and positive holes in the silicon substrate 1, an amperemeter 11, a constant voltage power supply 12, and a counter electrode 13 made of noble metal such as platinum or the like. Moreover, the etching apparatus is provided with a vessel 14 for containing the etchant 10, which is, for example, made of teflon or the like, and an outer frame 15 for protecting the silicon substrate holder 7 against the etchant 10. Hereupon, the outer frame 15 is, for example, made of teflon or the like.

In the etching apparatus, if a surface active agent or the like is added to the etchant 10, hydrogen produced during the etching process is easy to be released from the surface of the silicon substrate 1 so that the uniformity of the etching in the silicon substrate 1 may be improved. Further, if the contact resistance between the silicon substrate holder 7 and the silicon substrate 1 is lowered by implanting ions to the back side of the silicon substrate 1 and further forming a film of aluminum etc., for example, using a sputter apparatus, the etching process is stabilized so that the etching in the silicon substrate 1 may be uniformed. Consequently, the obtained silicon device may have high reliability. In addition, if an adhesive including silver particles is applied between the silicon substrate holder 7 and the silicon substrate 1, the contact resistance may be further lowered so that the above-mentioned effects may be raised.

Figure 3A:
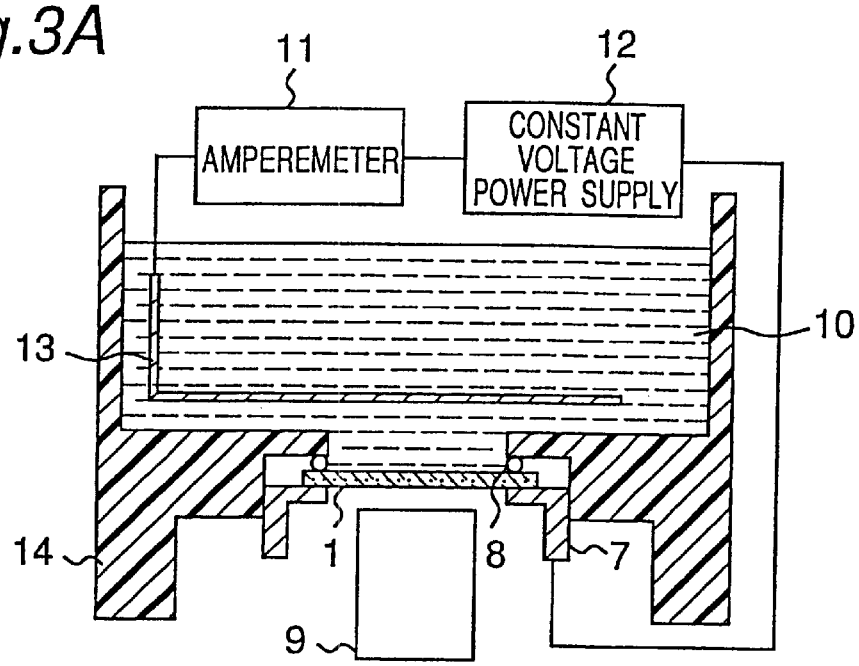
FIGS. 3A and 3B are sectional elevation views of further etching apparatuses which are used when the silicon substrate is etched in the manufacturing process of the silicon device according to the first embodiment of the present invention.

FIG. 3A shows another etching apparatus which is used when the main etching is performed in the manufacturing process of the silicon device according to the first embodiment of the present invention. The etching apparatus shown in FIG. 2 has such a construction that the spreading surface of the silicon substrate 1, to which the etching is performed, is directed downward and etched by the etchant 10 existing thereunder, while the light source 9 is disposed above the silicon substrate 1. On the other hand, the etching apparatus shown in FIG. 3A has such a construction that the spreading surface of the silicon substrate 1, to which the etching is performed, is directed upward and etched by the etchant 10 existing thereon, while the light source 9 is disposed under the silicon substrate 1. In the etching apparatus shown in FIG. 3A, during the etching step, bubbles produced near the spreading surface of the silicon substrate 1, to which the etching is performed, is facilitated to move upward, namely in the direction apart from the surface of the silicon substrate, by the buoyancy. In consequence, the bubbles are very easy to be released from the silicon substrate so that the uniformity of the etching in the silicon substrate 1 may be improved much more.

Figure 3B:
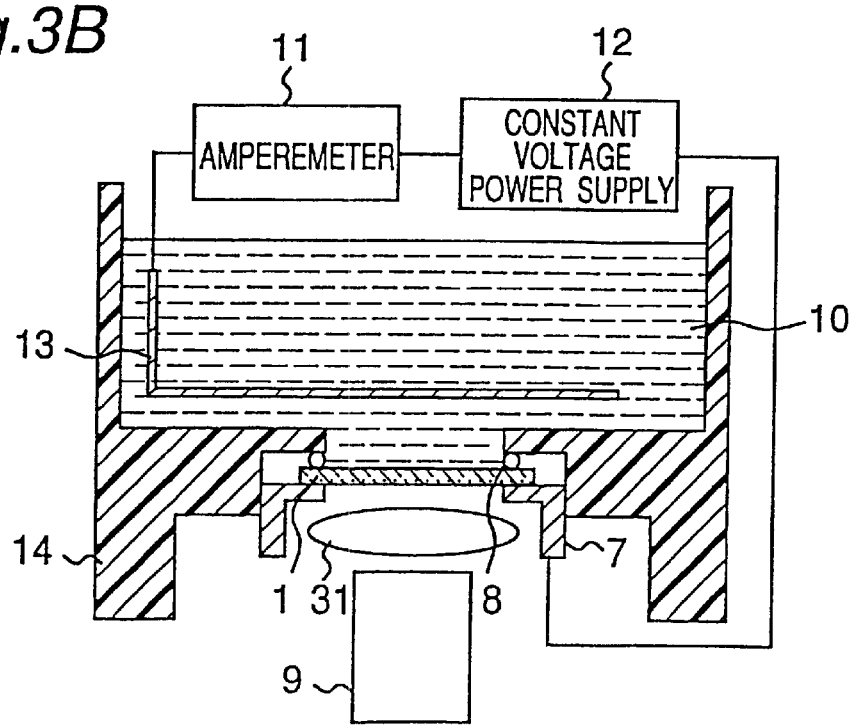

Meanwhile, as shown in FIG. 3B, a lens 31 may be disposed between the silicon substrate 1 and the light source 9 in the construction of the etching apparatus shown in FIG. 3A. In this case, because the light intensity within the silicon substrate 1 can be uniformed, the structure formed in the silicon substrate is also uniformed so that the obtained silicon device may have higher reliability.

(The Second Embodiment)

In the above-mentioned method of manufacturing the silicon device according to the first embodiment, the width or diameter (hereinafter, referred to "etching diameter") of the etched portion (openings, trenches) which is formed in the silicon substrate 1 by the etching process, depends on the current density in the silicon substrate 1. Thus, the relationship between the etching diameter and the current density in the n-type silicon substrate 1 was sought by etching the silicon substrate 1 while varying the current density in the substrate in various way, fundamentally using the etching apparatus according to the first embodiment, the concrete etching condition being set to those described below.

Namely, in the etching process, an n-type silicon substrate 1 of about 400 μm thickness was prepared, and then a silicon nitride film 2 of about 0.3 μm thickness was formed on the silicon substrate 1 by means of the sputter technique. Further, the silicon nitride film 2 was patterned by the photolithography technique so that a mask 3 for the initial etching performed before the main etching was formed. Next, the initial etching was performed by means of the reactive ion etching technique so that there were formed etching start patterns 4, each of which had a square-shaped opening with 4 μm sides (4 μm×4 μm) and had the depth of about 4 μm, the squares being disposed by 8 μm intervals (center-to-center interval). Then, using the etching apparatus shown in FIG. 2, a voltage of about 3V was applied between the silicon substrate 1 and the counter electrode 13 while the silicon substrate 1 was immersed in a hydrofluoric acid aqueous solution of about 5%, with the silicon substrate 1 used a positive electrode. On that occasion, light was applied to the back surface of the silicon substrate 1 using a halogen lamp of 150 w, whose light intensity could be arbitrarily varied, so that the silicon substrate 1 was etched in the direction depthwise of the silicon substrate 1 for thirty minutes. Hereupon, the current density in the silicon substrate 1 was adjusted by varying the light intensity of the halogen lamp.

Figure 4:
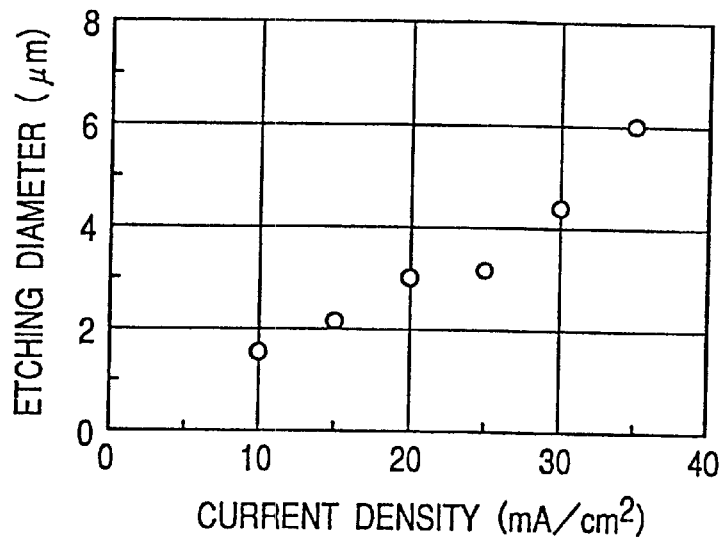
FIG. 4 is a graph showing the relationship between the etching diameter and the current density during the etching step in a manufacturing process of a silicon device according to the second embodiment of the present invention.

FIG. 4 shows the resultant relationship between the etching diameter and the current density in the n-type silicon substrate, which was obtained on the basis of the above-mentioned etching. Hereupon, the etching diameter was measured by cleaving the silicon substrate 1 after the completion of the etching and observing its section using a scanning electron microscope. According to FIG. 4, it may be understood that the etching diameters of the etched portions formed under the etching start patterns 4 can be controlled by varying the current density.

(The Third Embodiment)

As described above, in the method of manufacturing the silicon device according to the first embodiment, the etching diameter of the etched portion which is formed in the silicon substrate 1 by the etching process, depends on the current density in the silicon substrate 1. In the case, it may be estimated that if the current density in the silicon substrate 1 is varied during the etching process, the etching diameter varies in the direction depthwise of the substrate in accordance with the current density. For example, it may be estimated that if the current density is continuously decreased with a constant decreasing rate (decreasing speed), the etching diameter of the etched portion formed by the etching would decrease with a nearly constant decreasing rate toward the inner portion of the substrate. Thus, the relationship between the slanting angle of the side wall of the etched portion (etched surface) and the decreasing rate of the current density in the n-type silicon substrate 1 was sought by etching the silicon substrate 1 while varying the decreasing rate of the current density in the substrate in various way, fundamentally using the etching process according to the first embodiment, the concrete etching condition being set to those described below.

Namely, in the etching process, an n-type silicon substrate 1 of about 400 μm thickness was prepared, and then a silicon nitride film 2 of about 0.3 μm thickness was formed on the silicon substrate 1 by means of the sputter technique. Further, the silicon nitride film 2 was patterned by the photolithography technique so that a mask 3 for the initial etching performed before the main etching was formed. Next, the initial etching was performed by means of the reactive ion etching technique so that there were formed etching start patterns 4, each of which had a square-shaped opening with 4 μm sides (4 μm×4 μm) and had the depth of about 4 μm, the squares being disposed by 8 μm intervals (center-to-center interval). Then, using the etching apparatus shown in FIG. 2, a voltage of about 3V was applied between the silicon substrate 1 and the counter electrode while the silicon substrate 1 was immersed in a hydrofluoric acid aqueous solution of 5%, with the silicon substrate 1 used a positive electrode. On that occasion, light was applied to the back surface of the silicon substrate 1 using a halogen lamp of 150 w, whose light intensity could be arbitrarily varied, so that the silicon substrate 1 was etched in the direction depthwise of the silicon substrate 1 for ten minutes with the current density of 30 mA/cm$^2$. After that, the current density was decreased to 10 mA/cm$^2$ with a predetermined decreasing ratio of the current density. Hereupon, the density of the current flowing through the silicon substrate 1 was adjusted by varying the light intensity of the halogen lamp.

Figure 5:
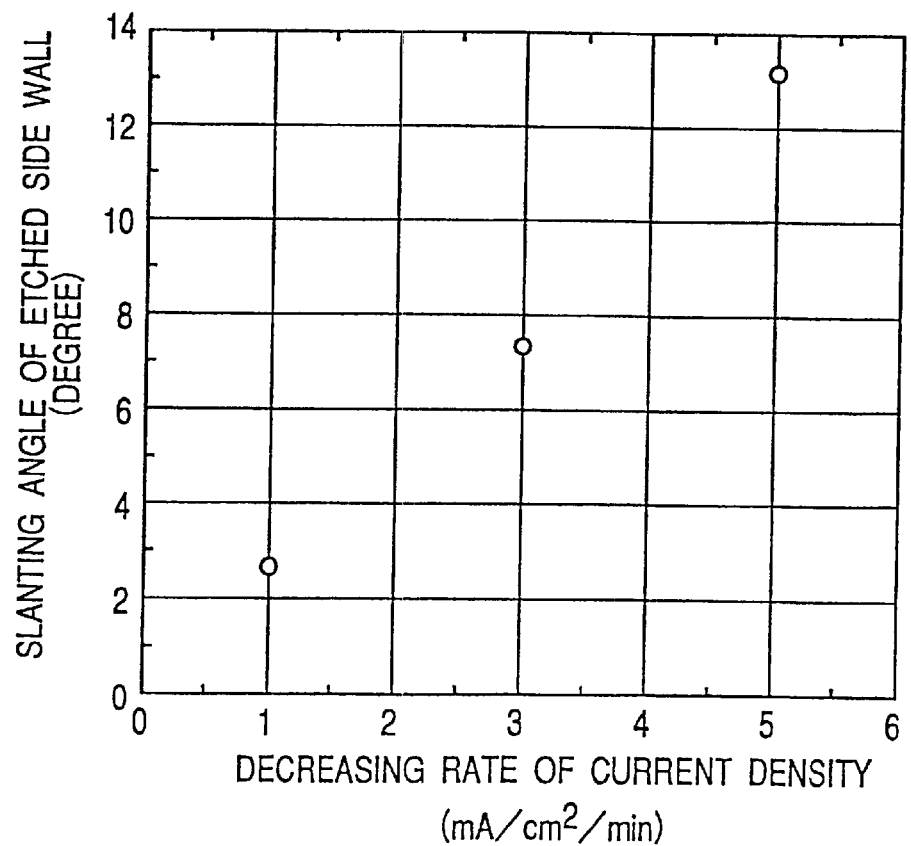
FIG. 5 is a graph showing the relationship between the slanting angle of the etched surface and the current density during the etching step in a manufacturing process of a silicon device according to the third embodiment of the present invention.

FIG. 5 shows the resultant relationship between the slanting angle of the etched surface (side wall of the etched portion) and the decreasing rate of the current density in the n-type silicon substrate 1, which was obtained on the basis of the above-mentioned etching. Hereupon, the slanting angle of the etched surface was measured by cleaving the silicon substrate 1 after the completion of the etching and observing its section using a scanning electron microscope. According to FIG. 5, it may be understood that the etching diameters of the etched portions formed under the etching start patterns 4 can be changed by varying the current density during the etching process.

(The Fourth Embodiment)

Hereinafter, the manufacturing process of the silicon device according to the fourth embodiment will be described. However, the manufacturing process of the silicon device according to the fourth embodiment has many things in common with the manufacturing process of the silicon device according to the first embodiment shown in FIGS. 1A to 1E. Thus, FIGS. 1A to 1E also conform to the fourth embodiment, except that the depth of the etching start pattern 4 is different from that of the first embodiment (3 $\mu$m in the first embodiment, but 1 $\mu$m in the fourth embodiment). Therefore, the fourth embodiment will be described with reference to FIGS. 1A to 1E, hereinafter.

In the manufacturing process of the silicon device according to the fourth embodiment, as shown in FIGS. 1A and 1B, for example, a silicon nitride film 2 of about 0.3 $\mu$m thickness is formed on an n-type silicon substrate 1 of about 400 $\mu$m thickness by means of the sputter technique or the like, and then the silicon nitride film 2 is patterned by means of the photolithography technique or the like so that there is formed a mask 3 for the initial etching which is performed before the main etching, as same as the case of the first embodiment.

Following that, the silicon substrate 1 (intermediate silicon device) is subjected to the initial etching process using the ion beam etching technique so that etching start patterns 4 of about 1 $\mu$m depth as shown in FIG. 1C are formed (but, the depth being shallower in comparison with the case of the first embodiment). Next, a voltage of about 3V is applied between the silicon substrate 1 and the counter electrode while the silicon substrate 1 is immersed in an ammonium fluoride aqueous solution of about 5%, with the silicon substrate 1 used a positive electrode. Hereupon, light is applied to the back surface of the silicon substrate 1 using a halogen lamp of 150 w, whose light intensity can be arbitrarily varied, so that the silicon substrate 1 is etched in the direction depthwise of the substrate, as shown in FIG. 1D. On that occasion, the light intensity of the halogen lamp is adjusted so that the current density in the silicon substrate 1 is larger than or equal to 10 mA/cm$^2$, and is smaller than or equal to 20 mA/cm$^2$. After the etching has reached the desired depth, the current density in the silicon substrate 1 is increased to or over 30 mA/cm$^2$ by increasing the light intensity of the halogen lamp. So, the etching process is performed for about ten minutes so that each neighboring etched surfaces are communicated with each other in the lower part of the intermediate silicon device. In consequence, as shown in FIG. 1E, a single crystal free standing structure 5 composed of a part of the silicon substrate 1 is formed, while a hollow portion 6 is formed below the free standing structure 5.

Hereupon, the depth of the hollow portion 6 can be set to any desired value by adjusting the time of etching process performed with the current density equal to or larger than 30 mA/cm$^2$ as described above. Further, it is preferable that the concentration of the ammonium fluoride aqueous solution used as the etchant is set to a value in the range from 1% to 20%. Because, it may be impossible to achieve a desired etching due to occurrence of electropolishing if the concentration of the ammonium fluoride aqueous solution is lower than 1%, while it may be impossible to obtain a smooth etched surface if it is higher than 20%. Meanwhile, it is preferable that the applied voltage is set to a value lower than or equal to 10V. Because, when the applied voltage is higher than 10V, a local dielectric breakdown may occur so that it may be difficult to obtain a smooth etched surface. Therefore, it may be difficult to obtain a desired shape of silicon device. Hereupon, as same as the case of the first embodiment, the applied voltage does not mean the voltage outputted from the constant voltage power supply, but the voltage which is applied to the silicon substrate 1. Further, it is preferable that the sheet resistance of the n-type silicon substrate 1 is set to a value in the range from 0.1 $\Omega \cdot$cm to 50 $\Omega \cdot$cm. Because, it may be impossible to obtain the desired shape of silicon device in which a micro porous silicon structure is formed on the etched surface if the sheet resistance of the n-type silicon substrate 1 is lower than 0.1 $\Omega \cdot$cm, while it may be difficult to make the silicon device fine-shaped if it is higher than 50 $\Omega \cdot$cm.

In the silicon device manufactured by the above-mentioned manufacturing process, because the free standing structure 5 is formed of single crystal silicon, the silicon device may have excellent mechanical properties and high reliability. Further, because it is possible to make the hollow portion 6 below the free standing structure 5 larger, the free standing structure 5 does not stick to the plate-shaped substrate thereunder. In consequence, its yield may be highly improved. Moreover, according to the manufacturing process of the silicon device, the movable portion including the free standing structure 5 can be fabricated in one step. Consequently, the manufacturing process may be simplified so that the silicon device may be obtained at a low cost.

Further, because the ion beam etching technique used for the initial etching is not affected by the crystal orientation of the silicon substrate 1, the etching start patterns 4 can be formed on the silicon substrate 1 in any desired shape. In consequence, the free standing structure 5 fabricated in the following etching process also can have any desired shape so that the obtained silicon device structure may have an excellent performance. Moreover, the etching rate of the ammonium fluoride against aluminum used for the wiring of the silicon device is smaller, in comparison with that of the hydrofluoric acid aqueous solution of the same concentration. In consequence, it is not required to protect the wiring during the etching process so that the manufacturing process may be simplified.

(The Fifth Embodiment)

FIGS. 6A to 6F show the manufacturing process of the silicon device according to the fifth embodiment of the present invention. Hereinafter, the manufacturing process of the silicon device according to the fifth embodiment will be described with reference to those drawings.

Figure 6A:
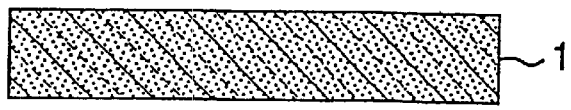
FIGS. 6A to 6F are sectional elevation views of a silicon substrate and intermediate silicon devices, respectively, which show a manufacturing process of a silicon device according to the fifth embodiment of the present invention.
Figure 6B:
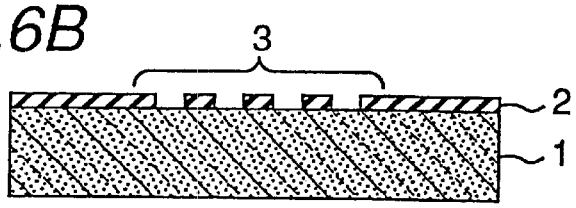
Figure 6C:
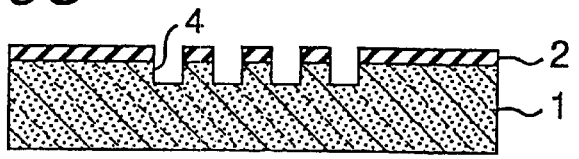

In the manufacturing process of the silicon device, as shown in FIGS. 6A to 6C, for example, a silicon nitride film 2 of about 0.3 $\mu$m thickness is formed on an n-type silicon substrate 1 of about 400 $\mu$m thickness by means of the sputter technique or the like, further the silicon nitride film 2 is patterned by means of the photolithography technique or the like so that a mask 3 for the initial etching is formed, and then the silicon substrate 1 is subjected to the initial etching process using the reactive ion etching technique so that etching start patterns 4 of about 3 $\mu$m depth are formed, as same as the case of the manufacturing process of the silicon device according to the first embodiment.

Figure 6D:
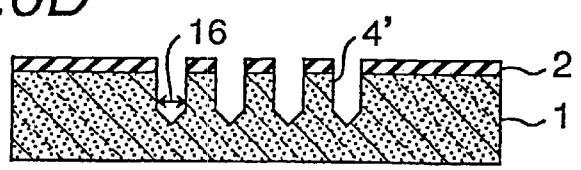
Figure 6E:
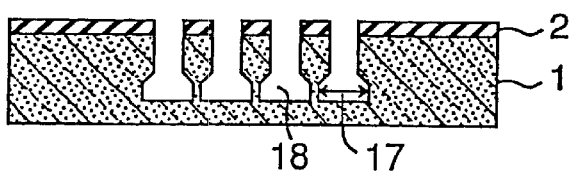
Figure 6F:
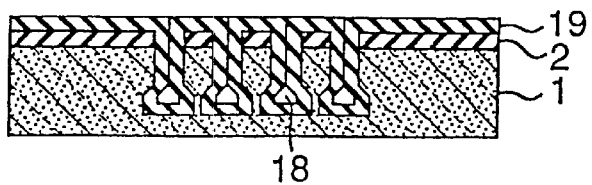

Next, a voltage of about 3V is applied between the silicon substrate 1 and a counter electrode while the silicon substrate 1 is immersed in a hydrofluoric acid aqueous solution of about 5%, with the silicon substrate 1 used a positive electrode. Hereupon, light is applied to the back surface of the silicon substrate 1 using a halogen lamp of 150 w, whose light intensity can be arbitrarily varied, so that the silicon substrate 1 is etched in the direction depthwise of the silicon substrate 1. On that occasion, the light intensity of the halogen lamp is adjusted so that the current density in the silicon substrate 1 is larger than or equal to 20 mA/cm$^2$, and is smaller than or equal to 30 mA/cm$^2$. Thus, as shown in FIG. 6D, comparatively narrower etched portions 4' (trenches) shown by the bi-directional arrow 16 are formed under the etching start patterns 4. After the etched portions 4' formed by the etching process have reached the desired depth, the current density in the silicon substrate 1 is increased to or over 30 mA/cm$^2$ by increasing the light intensity of the halogen lamp. So, the etching process is performed for fifteen minutes on the above-mentioned condition. Consequently, as shown in FIG. 6E, comparatively wider spaces 18 (etched portions) shown by the bi-directional arrow 17 are formed in the silicon substrate 1. Further, as shown in FIG. 6F, another silicon nitride film 19 is formed, for example, using the CVD technique, so that hollow passages are formed in the silicon substrate 1 by isolating the spaces 18 formed in the silicon substrate 1 from the outside.

Hereupon, it is preferable that the concentration of the hydrofluoric acid aqueous solution used as the etchant is set to a value in the range from 1% to 20%. That is, electropolishing may occur if the concentration of the hydrofluoric acid aqueous solution is lower than 1%, while it may be impossible to obtain a smooth etched surface if it is higher than 20%, in consequence it may be difficult to obtain a desired shape of device. Meanwhile, it is preferable that the applied voltage is set to a value lower than or equal to 10V. Because, when the applied voltage is higher than 10V, a local dielectric breakdown may occur so that it may be difficult to obtain a smooth etched surface, in consequence it may be difficult to obtain a desired shape of silicon device. Hereupon, as same as the case of the first embodiment, the applied voltage means the voltage which is actually applied to the silicon substrate 1. Further, it is preferable that the sheet resistance of the n-type silicon substrate 1 is set to a value in the range from 0.1 Ω·cm to 50 Ω·cm. Because, it may be impossible to obtain the desired shape of silicon device in which a micro porous silicon structure is formed on the etched surface if the sheet resistance of the n-type silicon substrate 1 is lower than 0.1 Ω·cm, while it may be difficult to make the silicon device fine-shaped if it is higher than 50 Ω·cm.

In the silicon device manufactured by the manufacturing process according to the fifth embodiment, because the hollow structure is formed of single crystal silicon, the silicon device may have excellent mechanical properties and high reliability. Further, because the reactive ion etching technique used for the initial etching is not affected by the crystal orientation of the silicon substrate 1, the etching start patterns 4 can be formed on the silicon substrate 1 in any desired shape. In consequence, the hollow passages 5 fabricated in the following etching process also can have any desired shape in the two-dimensional plane so that the obtained silicon device structure may have an excellent performance. Moreover, because the hollow passages in the silicon substrate 1, through which a fluid can be passed, may be fabricated by means of a simplified step using a low-priced apparatus, its productivity may be improved and further the silicon device may be obtained at a low cost.
(The Sixth Embodiment)

FIGS. 7A to 7E show the manufacturing process of the silicon device according to the sixth embodiment of the present invention. Hereinafter, the manufacturing process of the silicon device according to the sixth embodiment will be described with reference to those drawings.

Figure 7A:
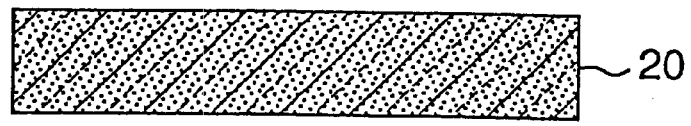
FIGS. 7A to 7E are sectional elevation views of a silicon substrate and intermediate silicon devices, respectively, which show a manufacturing process of a silicon device according to the sixth embodiment of the present invention.
Figure 7B:
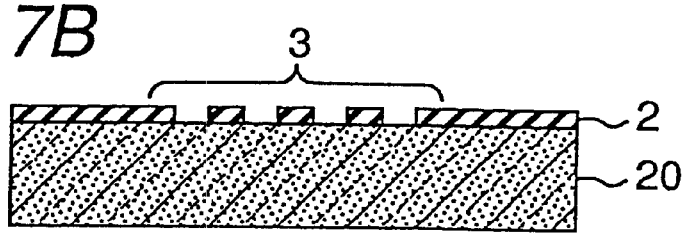
Figure 7C:
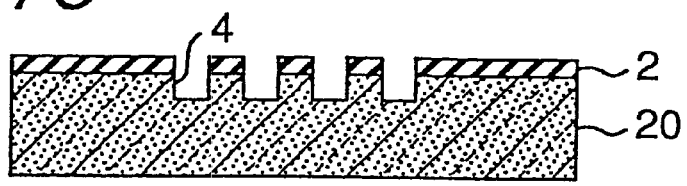

In the manufacturing process of the silicon device, at first, as shown in FIG. 7A, a p-type silicon substrate 20 of about 400 μm thickness is prepared. Further, as shown in FIG. 7B, for example, a silicon nitride film 2 of about 0.3 μm thickness is formed on the p-type silicon substrate 20 by means of the sputter technique or the like, and then the silicon nitride film 2 is patterned by means of the photolithography technique or the like so that there is formed a mask 3 for the initial etching which is performed before the main etching. Next, as shown in FIG. 7C, the silicon substrate 20 is subjected to the initial etching process using the reactive ion etching technique so that etching start patterns 4 of about 3 μm depth are formed.

Figure 7D:
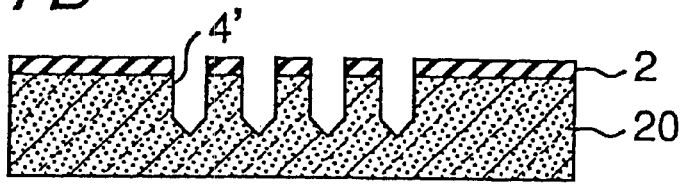
Figure 7E:
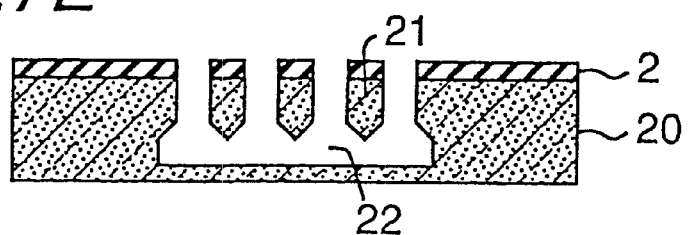

Next, a voltage of about 3V is applied between the silicon substrate 20 and the counter electrode while the silicon substrate 20 is immersed in an organic solution which contains hydrofluoric acid by 5%, water by 5% and dimethylformamide as the remainder, with the silicon substrate 20 used a positive electrode, in consequence the silicon substrate 20 is etched in the direction depthwise of the substrate. Hereupon, the output voltage of the power supply is adjusted so that the current density in the silicon substrate 20 is larger than or equal to 20 mA/cm$^2$, and is smaller than or equal to 30 mA/cm$^2$. Thus, as shown in FIG. 7D, etched portions 4' (trenches) formed under the etching start patterns 4 extend in the direction depthwise of the silicon substrate 20. Then, after the etched portions 4' formed by the etching process have reached the desired depth, the current density in the silicon substrate 20 is increased to or over 40 mA/cm$^2$ by raising the output voltage of the power supply. So, the etching process is performed for about ten minutes so that each neighboring etched surfaces are communicated with each other in the lower part of the intermediate silicon device. In consequence, as shown in FIG. 7E, a single crystal free standing structure 21 composed of a part of the silicon substrate 20 is formed, while a hollow portion 22 is formed below the free standing structure 21. Hereupon, the depth of the hollow portion 22 can be set to any desired value by adjusting the time of etching process performed with the current density equal to or larger than 40 mA/cm$^2$ as described above.

Hereupon, it is preferable that the hydrofluoric acid concentration in the etchant is set to a value in the range from 1% to 20%. That is, electropolishing may occur if the hydrofluoric acid concentration is lower than 1%, while if it is higher than 20%, it may be impossible to obtain a smooth etched surface so that it may be difficult to obtain the desired shape of device. Meanwhile, it is preferable that the applied voltage is set to a value lower than or equal to 10V. Because, when the applied voltage is higher than 10V, a local dielectric breakdown may occur so that it may be difficult to obtain a smooth etched surface. Therefore, it may be difficult to obtain the desired shape of silicon device. Hereupon, the applied voltage described above does not mean the voltage outputted from the power supply, but the voltage which is actually applied to the silicon substrate. Further, it is preferable that the sheet resistance of the p-type silicon substrate 20 is set to a value in the range from 0.01 Ω·cm to 500 Ω·cm. Because, it may be impossible to obtain the desired shape of silicon device in which a micro porous silicon structure is formed on the etched surface if the sheet resistance of the p-type silicon substrate 20 is lower than 0.01 Ω·cm, while it may be difficult to make the silicon device fine-shaped if it is higher than 500 Ω·cm.

In the silicon device manufactured by the manufacturing process according to the sixth embodiment, because the free standing structure 21 is formed of single crystal silicon, the silicon device may have excellent mechanical properties and high reliability. Further, because it is possible to make the hollow portion 22 below the free standing structure 21 larger, the free standing structure 21 does not stick to the plate-shaped substrate thereunder. In consequence, its yield may be highly improved. Moreover, according to the manufacturing process of the silicon device, the movable portion including the free standing structure 21 can be fabricated in one step. Consequently, the manufacturing process may be simplified so that the silicon device may be obtained at a low cost. Further, because the reactive ion etching technique used for the initial etching is not affected by the crystal orientation of the silicon substrate 20, the etching start patterns 4 can be formed on the silicon substrate 20 in any desired shape. In consequence, the free standing structure 21 fabricated in the following etching process also can have any desired shape so that the obtained silicon device structure may have an excellent performance.

Figure 8:
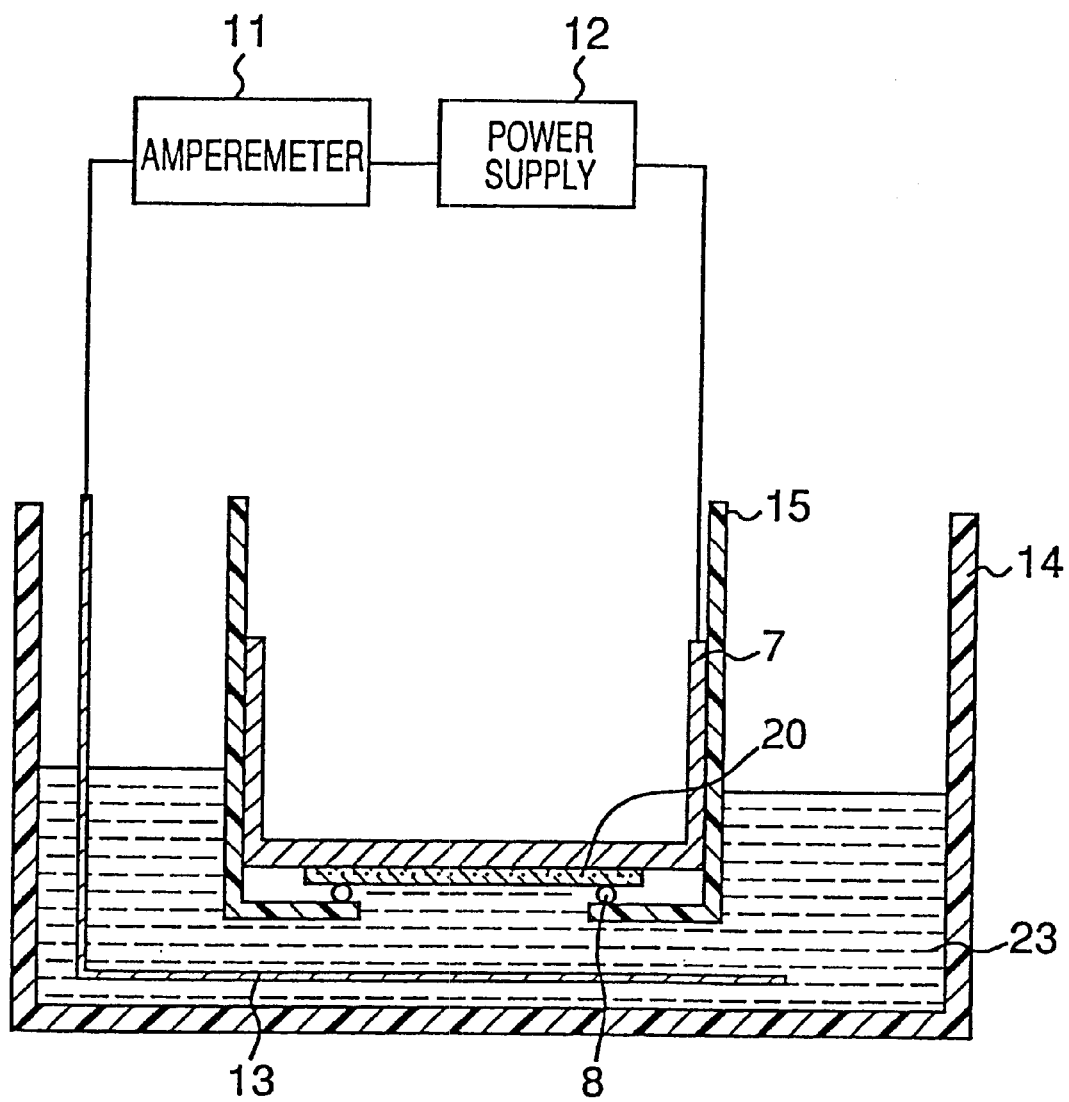
FIG. 8 is a sectional elevation view of an etching apparatus which is used when the silicon substrate is etched in the manufacturing process of the silicon device according to the sixth embodiment of the present invention.

FIG. 8 shows an etching apparatus which is used when the main etching is performed in the manufacturing process of the silicon device according to the sixth embodiment of the present invention. Hereupon, the above-mentioned etching apparatus has many things in common with the etching apparatus according to the first embodiment shown in FIG. 2. Therefore, in order to prevent duplicate descriptions, only things different from those of the etching apparatus shown in FIG. 2 will be described below. That is, as shown in FIG. 8, the etching apparatus according to the sixth embodiment is not provided with the light source 9 of the first embodiment (see FIG. 2). Further, the composition of the etchant 23 is different from that of the first embodiment. Moreover, the silicon substrate 20 is p-type one in contrast with the first embodiment. In addition, the output voltage of the power supply 12 is varied to adjust the current density in the silicon substrate 20, in contrast with the first embodiment. Other constructions or functions of the etching apparatus shown in FIG. 8 are as same as those of the etching apparatus shown in FIG. 2 according to the first embodiment.

In the etching apparatus, if a surface active agent or the like is added to the etchant 23, hydrogen produced during the etching process is easy to be released from the surface of the silicon substrate, and further the wettability between the etched surface and the etchant is improved. Consequently, the uniformity of the etching in the silicon substrate 20 may be improved. Hereupon, even if acetonitrile is used instead of dimethylformamide, the same effects may be obtained. Further, even if ammonium fluoride is used instead of hydrofluoric acid, the same effects may be obtained. Moreover, as same as the case of the first embodiment, if the contact resistance between the silicon substrate holder 7 and the silicon substrate 20 is lowered by implanting ions to the back side of the silicon substrate 20 and further forming a film of aluminum etc., for example, using a sputter apparatus, the etching process is stabilized so that the etching in the silicon substrate 20 may be uniformed. Consequently, the obtained silicon device may have high reliability. In addition, if an adhesive including silver particles is applied between the silicon substrate holder 7 and the silicon substrate 20, the contact resistance may be further lowered so that the above-mentioned effects may be raised.

Figure 9:
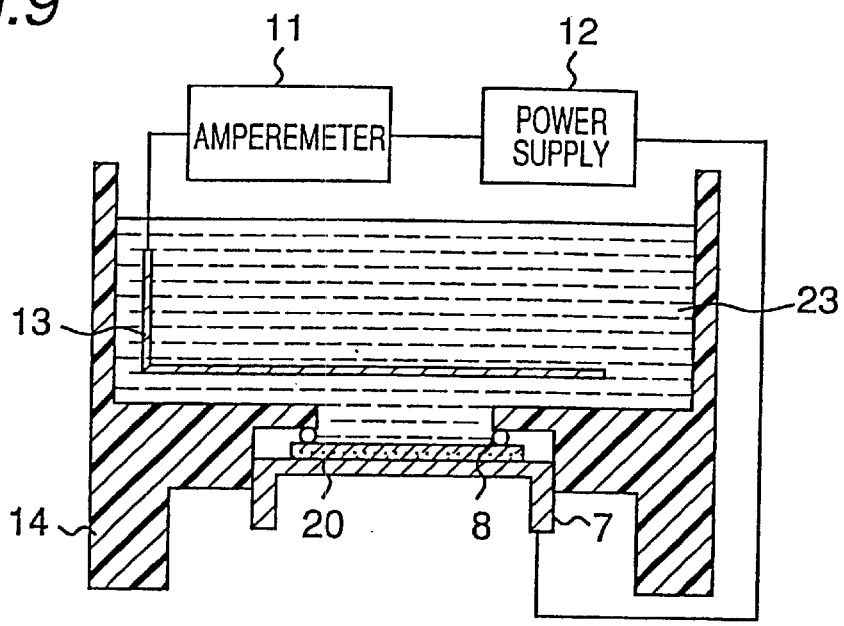
FIG. 9 is a sectional elevation view of another etching apparatus which is used when the silicon substrate is etched in the manufacturing process of the silicon device according to the sixth embodiment of the present invention.

FIG. 9 shows another etching apparatus which is used when the main etching is performed in the manufacturing process of the silicon device according to the sixth embodiment of the present invention. The etching apparatus shown in FIG. 8 has such a construction that the spreading surface of the silicon substrate 20, to which the etching is performed, is directed downward and etched by the etchant 23 existing thereunder. On the other hand, the etching apparatus shown in FIG. 9 has such a construction that the spreading surface of the silicon substrate 20, to which the etching is performed, is directed upward and etched by the etchant 23 existing thereon. In the etching apparatus shown in FIG. 9, during the etching step, bubbles produced near the spreading surface of the silicon substrate 20, to which the etching is performed, is facilitated to move upward, namely in the direction apart from the surface of the silicon substrate, by the buoyancy. In consequence, the bubbles are very easy to be released from the silicon substrate 20 so that the uniformity of the etching in the silicon substrate 20 may be improved much more.

(The Seventh Embodiment)

Figure 10A:
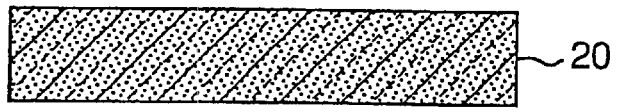
FIGS. 10A to 10C are sectional elevation views of a silicon substrate and intermediate silicon devices, respectively, which show the step of forming etching start patterns in a manufacturing process of a silicon device according to the seventh embodiment of the present invention.
Figure 10B:
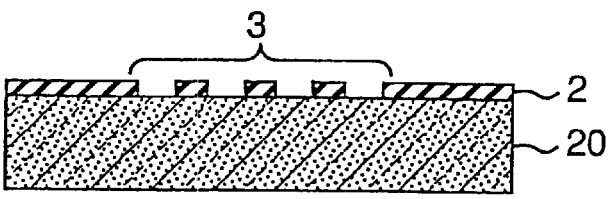
Figure 10C:
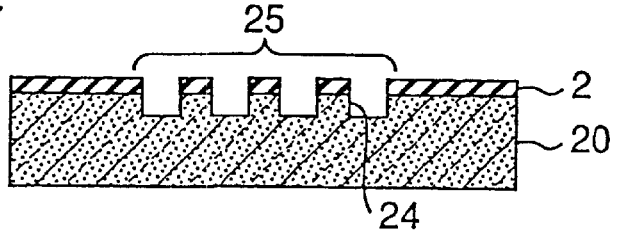

FIGS. 10A to 10C show the step of forming the etching start patterns in the manufacturing process of the silicon device according to the seventh embodiment of the present invention. Hereinafter, the manufacturing process of the silicon device according to the seventh embodiment will be described with reference to those drawings.

In the manufacturing process of the silicon device, at first, as shown in FIG. 10A, a p-type silicon substrate 20 of about 400 µm thickness is prepared. Further, as shown in FIG. 10B, for example, a silicon nitride film 2 of about 0.3 µm thickness is formed on the silicon substrate 20 by means of the sputter technique or the like, and then the silicon nitride film 2 is patterned by means of the photolithography technique or the like so that there is formed a mask 3 for the initial etching which is performed before the main etching. Next, as shown in FIG. 10C, the silicon substrate 20 is subjected to the initial etching process to form initial etched portions 24 using the reactive ion etching technique so that etching start patterns 25 are formed. Then, as same as the case of the sixth embodiment, the silicon substrate 20 is subjected to the main etching process so that a single crystal free standing structure 21 composed of a part of the silicon substrate 20 is formed, while a hollow portion 22 is formed below the free standing structure 21 (see FIG. 7E).

Because the reactive ion etching according to the seventh embodiment is not affected by the crystal orientation of the silicon substrate 20, the etching start patterns 25 can be formed on the silicon substrate 20 in any desired shape. In consequence, the free standing structure 21 fabricated in the following etching process also can have any desired shape so that the obtained silicon device structure may have an excellent performance. Hereupon, even if a resist is used instead of the silicon nitride film 2, there may be obtained etching start patterns 25 as same as the above. Further, even if the ion beam etching technique is used instead of the reactive ion etching technique, there may be obtained etching start patterns 25 with the same effects as the above.

(The Eighth Embodiment)

Figure 11A:
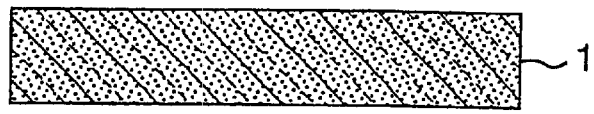
FIGS. 11A to 11C are sectional elevation views of a silicon substrate and intermediate silicon devices, respectively, which show the step of forming etching start patterns in a manufacturing process of a silicon device according to the eighth embodiment of the present invention.
Figure 11B:
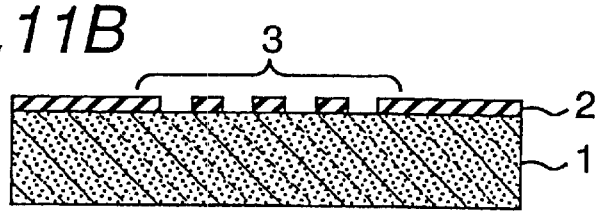
Figure 11C:
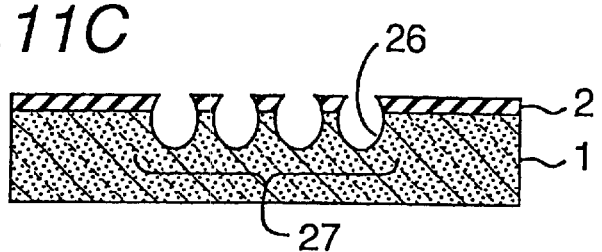

FIGS. 11A to 11C show the step of forming the etching start patterns in the manufacturing process of the silicon device according to the eighth embodiment of the present invention. Hereinafter, the manufacturing process of the silicon device according to the eighth embodiment will be described with reference to those drawings.

In the manufacturing process of the silicon device, at first, as shown in FIG. 11A, an n-type silicon substrate 1 of about 400 µm thickness is prepared. Further, as shown in FIG. 11B, for example, a silicon nitride film 2 of about 0.3 µm thickness is formed on the silicon substrate 1 by means of the sputter technique or the like, and then the silicon nitride film 2 is patterned by means of the photolithography technique or the like so that there is formed a mask 3 for the initial etching which is performed before the main etching. Next, as shown in FIG. 11C, the substrate is subjected to the isotropic wet etching process, for example, using hydrofluoric-nitric acid (mixture of hydrofluoric acid and nitric acid) as the etchant to form initial etching portions 26 so that etching start patterns 27 are formed. Then, as same as the case of the first embodiment, the intermediate silicon device is subjected to the main etching process so that a single crystal free standing structure 5 composed of a part of the silicon substrate 1 is formed, while a hollow portion 6 is formed below the free standing structure 5 (see FIG. 1E).

Because the isotropic wet etching according to the eighth embodiment is not affected by the crystal orientation of the silicon substrate 1, the etching start patterns can be formed on the silicon substrate 1 in any desired shape. In consequence, the hollow structure fabricated in the following etching process also can have any desired shape so that the obtained silicon device structure may have an excellent performance. Further, the etching process for forming the etching start patterns 27 is one of wet etching type, the etching apparatus may be low-priced. Meanwhile, because it is possible to simultaneously form etching start patterns 27 to a plurality of plate-shaped substrates, the silicon device may be obtained at a low cost.

(The Ninth Embodiment)

Figure 12A:
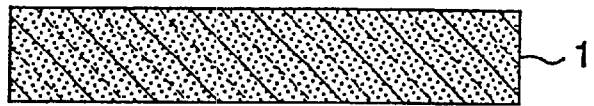
FIGS. 12A and 12B are sectional elevation views of a silicon substrate and an intermediate silicon device, respectively, which show the step of forming etching start patterns in a manufacturing process of a silicon device according to the ninth embodiment of the present invention.
Figure 12B:
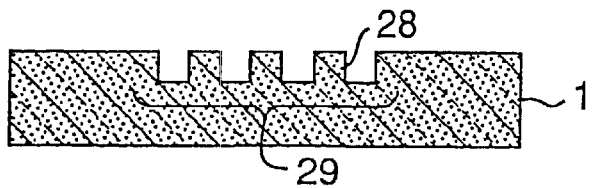

FIGS. 12A and 12B show the step of forming the etching start patterns in the manufacturing process of the silicon device according to the ninth embodiment of the present invention. Hereinafter, the manufacturing process of the silicon device according to the ninth embodiment will be described with reference to those drawings.

In the manufacturing process of the silicon device, at first, as shown in FIG. 12A, for example, a plate-shaped n-type silicon substrate 1 (plate-shaped substrate) of about 400 μm thickness is prepared. Further, as shown in FIG. 12B, a direct writing 28 is formed on the silicon substrate 1, for example, using a laser beam so that etching start patterns 29 for the etching are formed. Then, as same as the case of the first embodiment, the intermediate silicon device is subjected to the main etching process so that a single crystal free standing structure 5 composed of a part of the silicon substrate 1 is formed, while a hollow portion 6 is formed below the free standing structure 5 (see FIG. 1E).

In the manufacturing process according to the ninth embodiment, because the etching start patterns 29 are not affected by the crystal orientation of the silicon substrate 1, the etching start patterns can be formed on the silicon substrate 1 in any desired shape. In consequence, the hollow structure fabricated in the following etching process also can have any desired shape so that the fabricated silicon device structure may have an excellent performance. Further, when the etching start patterns 29 are formed, it is not required to use a mask and an etching process using the mask, for forming the etching start patterns 29. Therefore, the manufacturing process may be simplified so that the silicon device may be obtained at a low cost. Hereupon, even if a focused ion beam is used instead of the laser beam, it may be possible to form the etching start patterns as same as the above.

(The Tenth Embodiment)

Figure 13A:
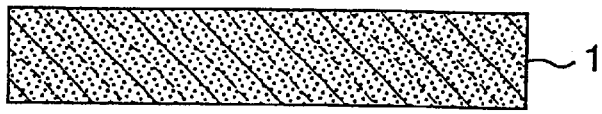
FIGS. 13A and 13B are sectional elevation views of a silicon substrate and an intermediate silicon device, respectively, which show the step of forming etching start patterns in a manufacturing process of a silicon device according to the tenth embodiment of the present invention.
Figure 13B:
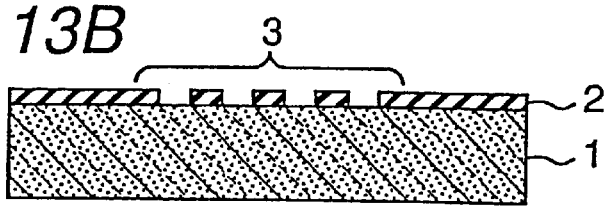

FIGS. 13A and 13B show the step of forming the etching start patterns in the manufacturing process of the silicon device according to the tenth embodiment of the present invention. Hereinafter, the manufacturing process of the silicon device according to the tenth embodiment will be described with reference to those drawings.

In the manufacturing process of the silicon device, at first, as shown in FIG. 13A, for example, a plate-shaped n-type silicon substrate 1 (plate-shaped substrate) of about 400 μm thickness is prepared. Further, as shown in FIG. 13B, for example, a silicon nitride film 2 of about 0.3 μm thickness is formed on the silicon substrate 1 by means of the sputter technique or the like, and then the silicon nitride film 2 is patterned by means of the photolithography technique or the like so that there is formed a mask 3 for the etching. Thus, the mask 3 is used as etching start patterns. Then, as same as the case of the first embodiment, the silicon substrate 1 is subjected to the main etching process so that a single crystal free standing structure 5 composed of a part of the silicon substrate 1 is formed, while a hollow portion 6 is formed below the free standing structure 5 (see FIG. 1E).

In the manufacturing process according to the tenth embodiment, because the etching start patterns are not affected by the crystal orientation of the silicon substrate 1, the etching start patterns can be formed on the silicon substrate 1 in any desired shape. In consequence, the free standing structure fabricated in the following etching process also can have any desired shape so that the fabricated silicon device structure may have an excellent performance. Hereupon, in the manufacturing process, although the accuracy of the shape of the device is a little inferior in comparison with the case that the pits are formed on the surface of the silicon substrate by performing the initial etching, the manufacturing process is simplified so that the device may be obtained at a low cost.

(The Eleventh Embodiment)

Figure 14A:
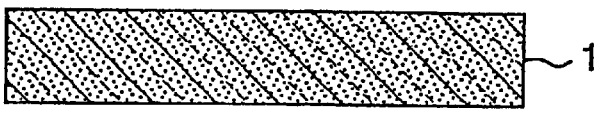
FIGS. 14A to 14C are sectional elevation views of a silicon substrate and intermediate silicon devices, respectively, which show the step of forming etching start patterns in a manufacturing process of a silicon device according to the eleventh embodiment of the present invention.
Figure 14B:
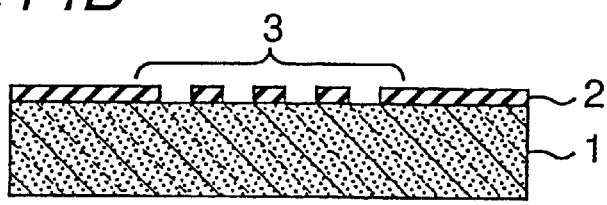
Figure 14C:
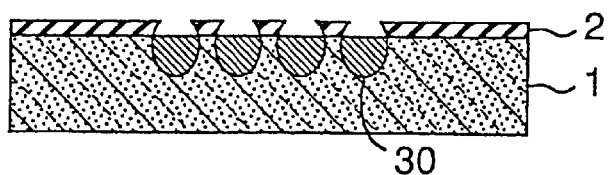
Figure 15A:
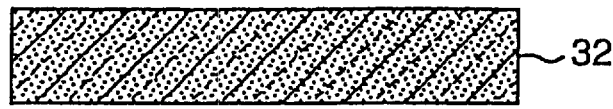
FIGS. 15A to 15F are sectional elevation views of a silicon substrate and intermediate silicon devices, respectively, which show a conventional manufacturing process of the silicon device having a free standing structure.
Figure 15B:
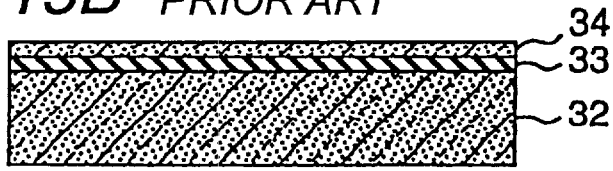
Figure 15C:
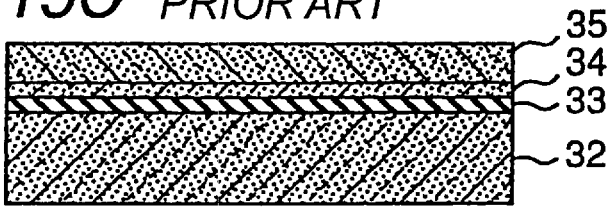
Figure 15D:
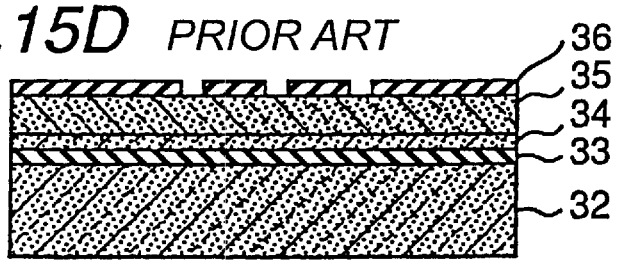
Figure 15E:
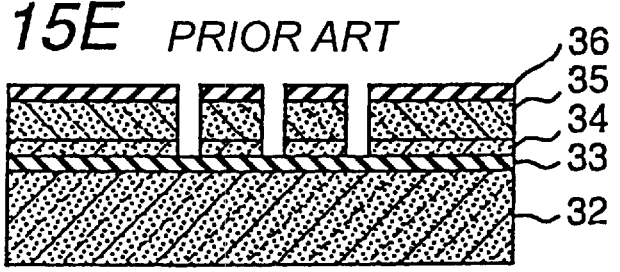
Figure 15F:
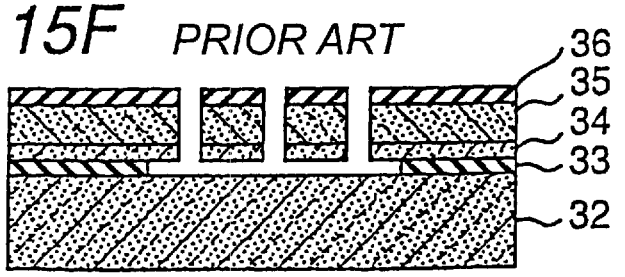
Figure 16A:
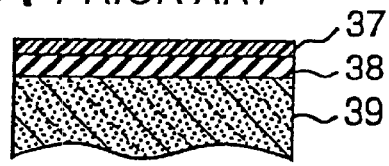
FIGS. 16A to 16E are sectional elevation views of a silicon substrate and intermediate silicon devices, respectively, which show another conventional manufacturing process of a silicon device having a free standing structure.
Figure 16B:
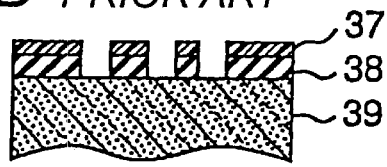
Figure 16C:
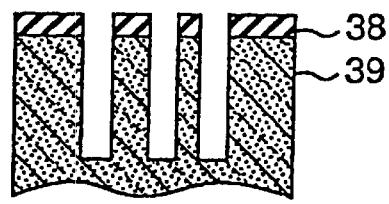
Figure 16D:
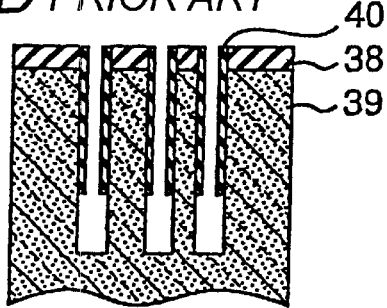
Figure 16E:
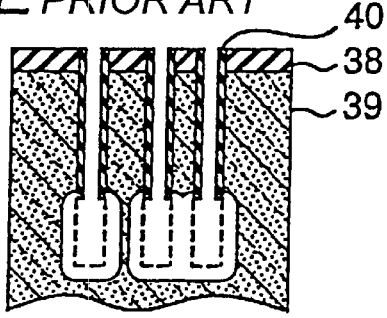
Figure 17:
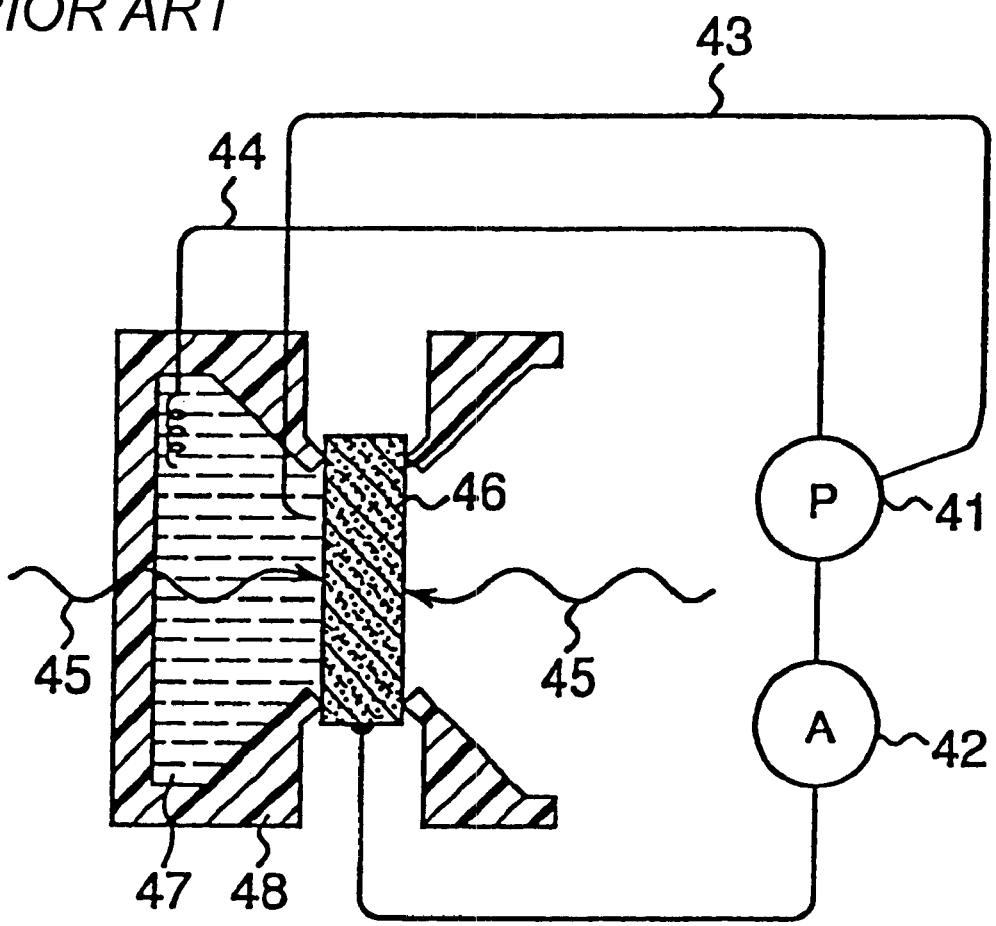
FIG. 17 is a sectional elevation view of an etching apparatus which is used in the conventional manufacturing process of the silicon device having the free standing structure.
Figure 18A:
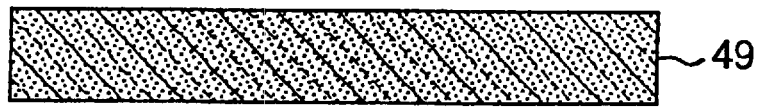
FIGS. 18A to 18F are sectional elevation views of a silicon substrate and intermediate products of a silicon device, respectively, which show a conventional trench forming step for forming trenches on the silicon substrate.
Figure 18B:
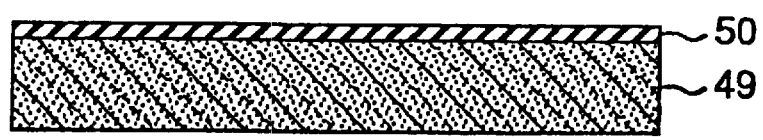
Figure 18C:
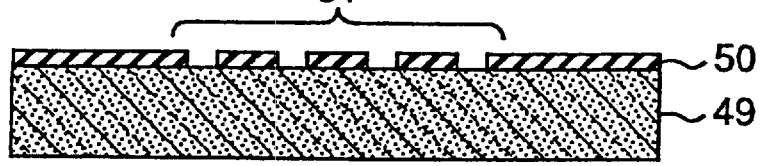
Figure 18D:
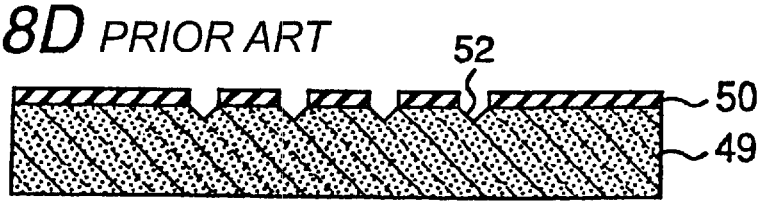
Figure 18E:
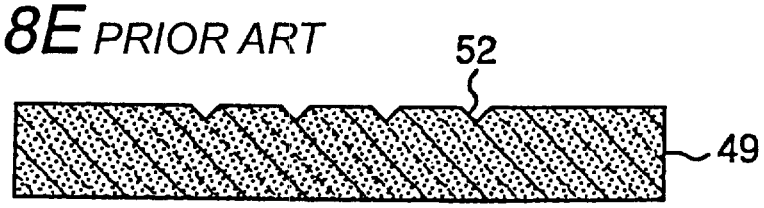
Figure 18F:
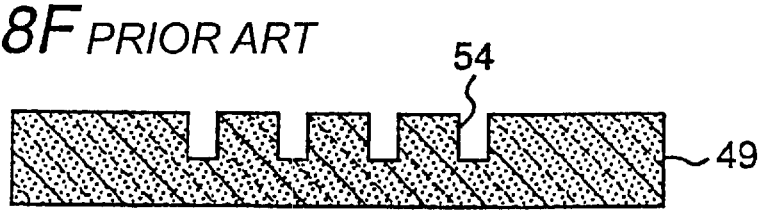
Figure 19:
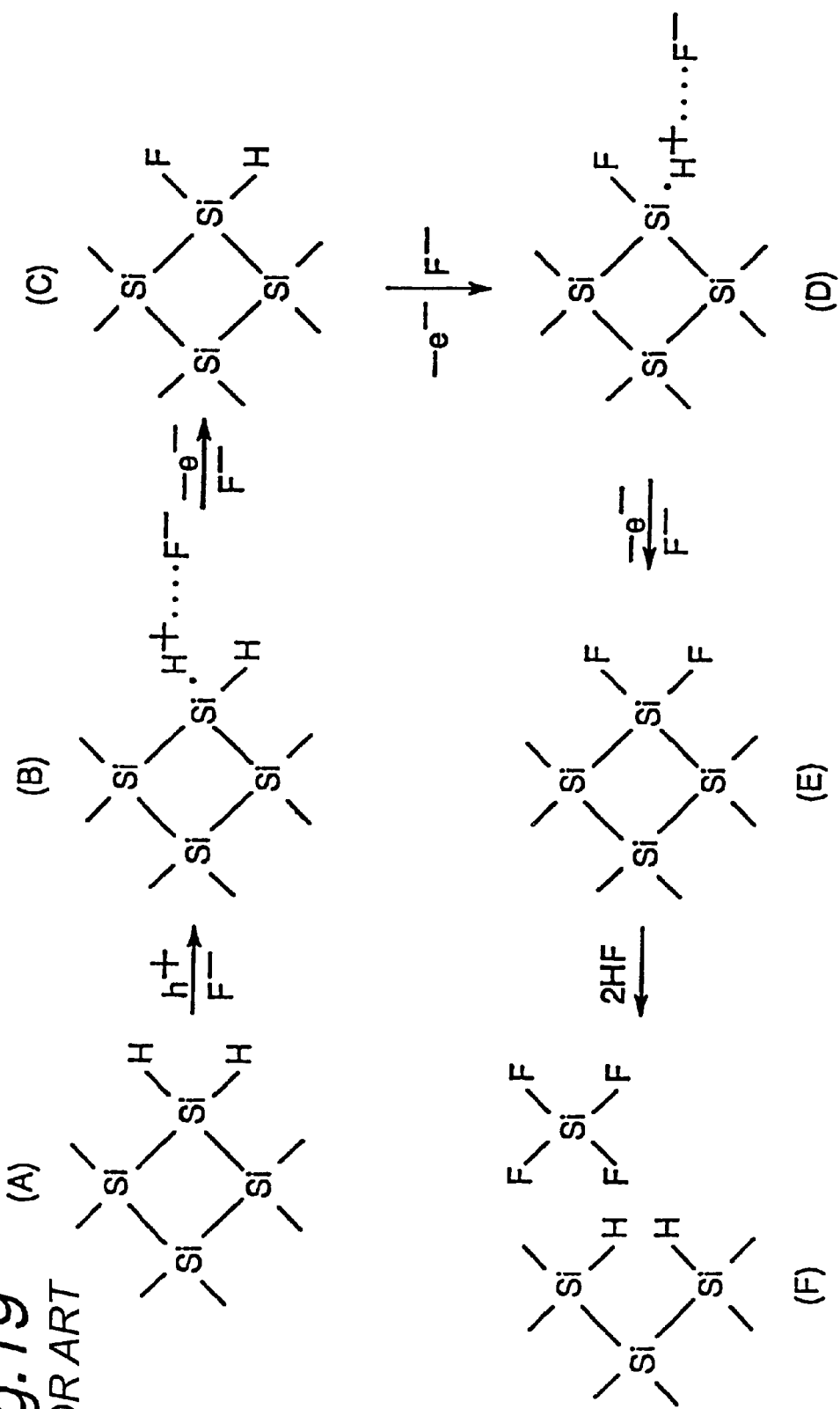
FIG. 19 is a view showing a reaction mechanism when p-type silicon is etched.

FIGS. 14A to 14C show the step of forming the etching start patterns in the manufacturing process of the silicon device according to the eleventh embodiment of the present invention. Hereinafter, the manufacturing process of the silicon device according to the eleventh embodiment will be described with reference to those drawings.

In the manufacturing process of the silicon device, at first, as shown in FIG. 14A, for example, a plate-shaped n-type silicon substrate 1 of about 400 μm thickness is prepared. Further, as shown in FIG. 14B, for example, a silicon nitride film 2 of about 0.3 μm thickness is formed on the silicon substrate 1 by means of the sputter technique or the like, and then the silicon nitride film 2 is patterned by means of the photolithography technique or the like so that there is formed a mask 3 for the initial etching which is performed before the main etching. Next, as shown in FIG. 14C, ions for forming p-type silicon, such as boron or the like, are implanted into the substrate using the mask 3 so that there are formed etching start patterns 30 patterned by the p-type regions. Then, as same as the case of the first embodiment, the silicon substrate 1 is subjected to the main etching process so that a single crystal free standing structure 5 composed of a part of the silicon substrate 1 is formed, while a hollow portion 6 is formed below the free standing structure 5 (see FIG. 1E).

In the manufacturing process according to the eleventh embodiment, because the mask 3 used for the ion implantation is not affected by the crystal orientation of the silicon substrate 1, the etching start patterns can be formed on the silicon substrate 1 in any desired shape. In consequence, the hollow structure fabricated in the following etching process also can have any desired shape so that the obtained silicon device structure may have an excellent performance.

Industrial Applicability

As described above, the method of manufacturing the silicon device according to the present invention is particularly useful for fabricating the silicon device whose hollow structure is composed of single crystal silicon, and suitable for using as the manufacturing process of the silicon device such as various sensors used for measuring inertia force indicating acceleration or angular velocity etc., pressure or other various physical quantities, or a fluid device having a passage through which fluid or the like flows, the passage being formed in the silicon substrate.

What is claimed is:

1. A method of manufacturing a silicon device comprising:

forming etching start patterns at a surface of a silicon substrate;

etching said silicon substrate by applying a voltage to said silicon substrate while said silicon substrate is immersed in a solution containing fluorine ions, with said silicon substrate used a positive electrode, to form etched portions extending into said silicon substrate from said etching start patterns; and accelerating etching of said silicon substrate by increasing current flowing through said silicon substrate after said etched portions have reached a threshold depth in said silicon substrate, to form a free standing structure, including a part of said silicon substrate, in which neighboring etched portions are in communication with each other at a location deeper than the threshold depth.

2. A method of manufacturing a silicon device comprising:

forming etching start patterns at a surface of a silicon substrate;

etching said silicon substrate by applying a voltage to said silicon substrate while said silicon substrate is immersed in a solution containing fluorine ions, with said silicon substrate used a positive electrode, to form narrow etched portions extending into said silicon substrate from said etching start patterns;

accelerating etching of said silicon substrate by increasing current flowing through said silicon substrate after said narrow etched portions have reached a threshold depth in said silicon substrate, to form wide etched portions, wider than said narrow etched portions, at a location deeper than the threshold depth; and forming a hollow passage in said silicon substrate by filling said narrow etched portions after said wide etched portions have reached a second threshold depth.

3. The method of manufacturing a silicon device according to claim 1, including forming pits on the surface of said silicon substrate as said etching start patterns.

4. The method of manufacturing a silicon device according to claim 2, including forming pits on the surface of said silicon substrate as said etching start patterns.

5. The method of manufacturing a silicon device according to claim 1, including forming a mask on said silicon substrate, said mask being used as said etching start patterns.

6. The method of manufacturing a silicon device according to claim 2, including forming a mask on said silicon substrate, said mask being used as said etching start patterns.

7. The method of manufacturing a silicon device according to claim 1, wherein said silicon substrate is n-type, including forming a p-type region in the surface of said silicon substrate, said p-type region being used as said etching start patterns.

8. The method of manufacturing a silicon device according to claim 2, wherein said silicon substrate is n-type, including forming a p-type region in the surface of said silicon substrate, said p-type region being used as said etching start patterns.

9. The method of manufacturing a silicon device according to claim 1, wherein said silicon substrate is n-type, including controlling the current flowing through said silicon substrate, while applying light to said silicon substrate, by changing one of intensity of light and the voltage applied to said silicon substrate while applying the light to said silicon substrate in etching and accelerating etching of said silicon substrate.

10. The method of manufacturing a silicon device according to claim 2, wherein said silicon substrate is n-type, including controlling the current flowing through said silicon substrate, while applying light to said silicon substrate, by changing one of intensity of the light and the voltage applied to said silicon substrate in etching and accelerating etching of said silicon substrate.

11. The method of manufacturing a silicon device according to claim 1, wherein said silicon substrate is p-type, including controlling the current flowing through said silicon substrate by changing the voltage applied to said silicon substrate in each of etching and accelerating etching of said silicon substrate.

12. The method of manufacturing a silicon device according to claim 2, wherein said silicon substrate is p-type, including controlling the current flowing through said silicon substrate by changing the voltage applied to said silicon substrate in each of etching and accelerating etching of said silicon substrate.

13. A method of manufacturing a silicon device comprising:

forming etching start patterns at a surface of a silicon substrate;

etching said silicon substrate by applying a voltage to said silicon substrate while said silicon substrate is immersed in a solution containing fluorine ions, with said silicon substrate used a positive electrode, to form etched portions extending into said silicon substrate from said etching start patterns; and accelerating etching of said silicon substrate by increasing current flowing through said silicon substrate by changing the voltage applied to said silicon substrate, after said etched portions have reached a threshold depth in said silicon substrate, to form a free standing structure, including a part of said silicon substrate, in which neighboring etched portions are in communication with each other at a location deeper than the threshold depth.

14. The method of manufacturing a silicon device according to claim 13, including forming pits on the surface of said silicon substrate as said etching start patterns.

15. The method of manufacturing a silicon device according to claim 13, including forming a mask on said silicon substrate, said mask being used as said etching start patterns.

16. The method of manufacturing a silicon device according to claim 13, wherein said silicon substrate is n-type, including forming a p-type region in the surface of said silicon substrate, said p-type region being used as said etching start patterns.

17. The method of manufacturing a silicon device according to claim 13, wherein said silicon substrate is n-type, including controlling the current flowing through said silicon substrate while applying light to said silicon substrate by changing intensity of the light applied to said silicon substrate in etching and accelerating etching of said silicon substrate.

18. The method of manufacturing a silicon device according to claim 13, wherein said silicon substrate is p-type, including controlling the current flowing through said silicon substrate by changing the voltage applied to said silicon substrate in each of said etching and accelerating etching of said silicon substrate.

* * * * *